(12) United States Patent
Watanabe et al.

(10) Patent No.: US 8,913,398 B2
(45) Date of Patent: *Dec. 16, 2014

(54) MOUNT BOARD AND ELECTRONIC DEVICE

(71) Applicants: Shinji Watanabe, Tokyo (JP); Nobuhiro Mikami, Tokyo (JP); Junya Sato, Tokyo (JP); Kenichiro Fujii, Tokyo (JP); Katsumi Abe, Tokyo (JP); Atsumasa Sawada, Tokyo (JP)

(72) Inventors: Shinji Watanabe, Tokyo (JP); Nobuhiro Mikami, Tokyo (JP); Junya Sato, Tokyo (JP); Kenichiro Fujii, Tokyo (JP); Katsumi Abe, Tokyo (JP); Atsumasa Sawada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/016,707

(22) Filed: Sep. 3, 2013

(65) Prior Publication Data

US 2014/0003015 A1    Jan. 2, 2014

Related U.S. Application Data

(60) Continuation of application No. 13/158,037, filed on Jun. 10, 2011, now Pat. No. 8,625,296, which is a division of application No. 12/093,496, filed as application No. PCT/JP2006/322251 on Nov. 8, 2006.

(30) Foreign Application Priority Data

Nov. 18, 2005    (JP) ................. 2005-334649

(51) Int. Cl.
*H05K 7/00*    (2006.01)
*H05K 3/00*    (2006.01)
(Continued)

(52) U.S. Cl.
CPC .......... *H05K 1/18* (2013.01); *H05K 2203/1469* (2013.01); *H01L 2924/01078* (2013.01);
(Continued)

(58) Field of Classification Search
USPC ......... 361/760, 748–751, 728, 767, 768, 777, 361/783, 792, 795; 174/260, 261
See application file for complete search history.

(56) References Cited

U.S. PATENT DOCUMENTS 4,548,451 A    10/1985  Benarr et al.
5,328,553 A    7/1994   Poon
(Continued)

FOREIGN PATENT DOCUMENTS

JP    1-289186 A    11/1989
JP    466117 A      10/1992
(Continued)

OTHER PUBLICATIONS

Japanese Office Action issued in corresponding Japanese Application No. 2007-545204 on Sep. 6, 2011.

(Continued)

*Primary Examiner* — Hoa C Nguyen
(74) *Attorney, Agent, or Firm* — Sughrue Mion, PLLC

(57) ABSTRACT

An object of the present invention is to allow stress that may be applied to a semiconductor package to be suppressed, when the semiconductor package is mounted on a curved board. In a mount board 1, a semiconductor package 20 is mounted on a curved board 10 including a curved surface on at least a portion thereof. The curved board 10 includes a pedestal portion 13a disposed on a region of the curved surface portion where the semiconductor package 20 is mounted and having an upper surface thereof formed flat, and a plurality of pad portions 15a disposed on the flat surface of the pedestal portion 13a. The pedestal portion 13a is formed of an insulating material. The semiconductor package 20 is mounted on the pad portions 15a.

8 Claims, 20 Drawing Sheets

(51) Int. Cl.
*H01L 23/00* (2006.01)
*H05K 1/02* (2006.01)
*H05K 1/18* (2006.01)
*H05K 3/46* (2006.01)
*H05K 3/32* (2006.01)

(52) U.S. Cl.
CPC .............. *H05K 1/185* (2013.01); *H05K 3/0014* (2013.01); *H05K 2201/09036* (2013.01); *H05K 1/189* (2013.01); *H05K 2201/09436* (2013.01); *H01L 24/82* (2013.01); *H05K 1/023* (2013.01); *H05K 3/4644* (2013.01); *H01L 2224/18* (2013.01); *H05K 2201/0187* (2013.01); *H01L 2924/3511* (2013.01); *H05K 3/32* (2013.01); *H05K 2201/10515* (2013.01); *H01L 2924/19043* (2013.01); *H01L 2924/01029* (2013.01); *H05K 2201/10477* (2013.01); *H01L 2924/3011* (2013.01); *H05K 2201/09118* (2013.01); *H01L 2924/01019* (2013.01); *H01L 24/18* (2013.01); *H05K 2201/1053* (2013.01); *H05K 2201/10636* (2013.01); *H01L 2924/19105* (2013.01); *H05K 2201/0195* (2013.01); *H01L 2224/16225* (2013.01); *H05K 2201/09018* (2013.01); *H01L 2924/01005* (2013.01); *H01L 2924/01082* (2013.01); *H01L 2224/76155* (2013.01); *H01L 2924/19041* (2013.01); *H05K 1/0284* (2013.01); *H05K 2201/0191* (2013.01); *H01L 2924/01006* (2013.01); *H05K 2201/09045* (2013.01); *H05K 2203/302* (2013.01); *H01L 2924/01004* (2013.01); *H05K 1/0271* (2013.01); *H01L 2924/014* (2013.01); *H05K 2201/10734* (2013.01); *H01L 2924/01033* (2013.01)
USPC ........... 361/760; 361/748; 361/767; 361/777; 174/261

(56) References Cited

U.S. PATENT DOCUMENTS

| | | | | |
|---|---|---|---|---|
| 5,471,151 | A | * 11/1995 | DiFrancesco | 324/754.11 |
| 5,940,729 | A | 8/1999 | Downes, Jr. et al. | |
| 6,027,958 | A | 2/2000 | Vu et al. | |
| 6,288,451 | B1 | 9/2001 | Tsao | |
| 6,392,143 | B1 * | 5/2002 | Koshio | 174/528 |
| 6,785,144 | B1 * | 8/2004 | Akram | 361/749 |
| 7,138,723 | B2 * | 11/2006 | Aiba et al. | 257/778 |

FOREIGN PATENT DOCUMENTS

| | | |
|---|---|---|
| JP | 5-110255 A | 4/1993 |
| JP | 5-291428 A | 11/1993 |
| JP | 6-168985 A | 6/1994 |
| JP | 6334279 A | 12/1994 |
| JP | 7-221433 A | 8/1995 |
| JP | 9-186042 A | 7/1997 |
| JP | 2002-353595 A | 12/2002 |
| JP | 3395164 B2 | 4/2003 |
| JP | 2003-133693 A | 5/2003 |
| JP | 2003-318218 A | 11/2003 |
| JP | 2005-117073 A | 4/2005 |
| WO | 9832170 A1 | 7/1998 |

OTHER PUBLICATIONS

Notice of Grounds for Rejection dated Dec. 6, 2011 issued by the Japanese Patent Office in counterpart Japanese Patent Application No. 2007-545204.

Non-final Office Action issued Dec. 17, 2012 in Parent U.S. Appl. No. 13/158,037.

Final Office Action issued May 23, 2013 in Parent U.S. Appl. No. 13/158,037.

* cited by examiner

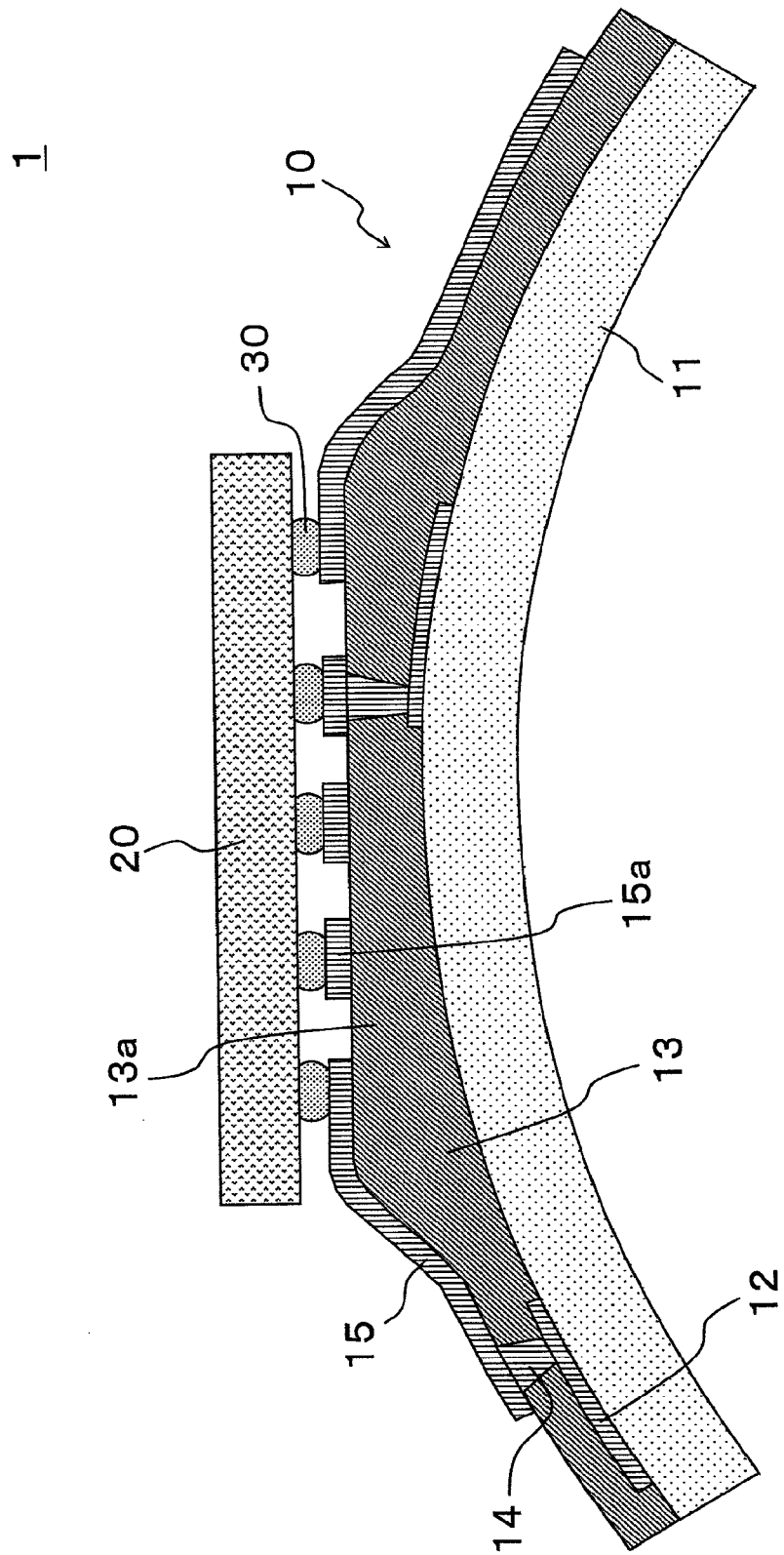
FIG.1 (FIRST EXEMPLARY EMBODIMENT)

FIG.2 (FIRST EXEMPLARY EMBODIMENT)
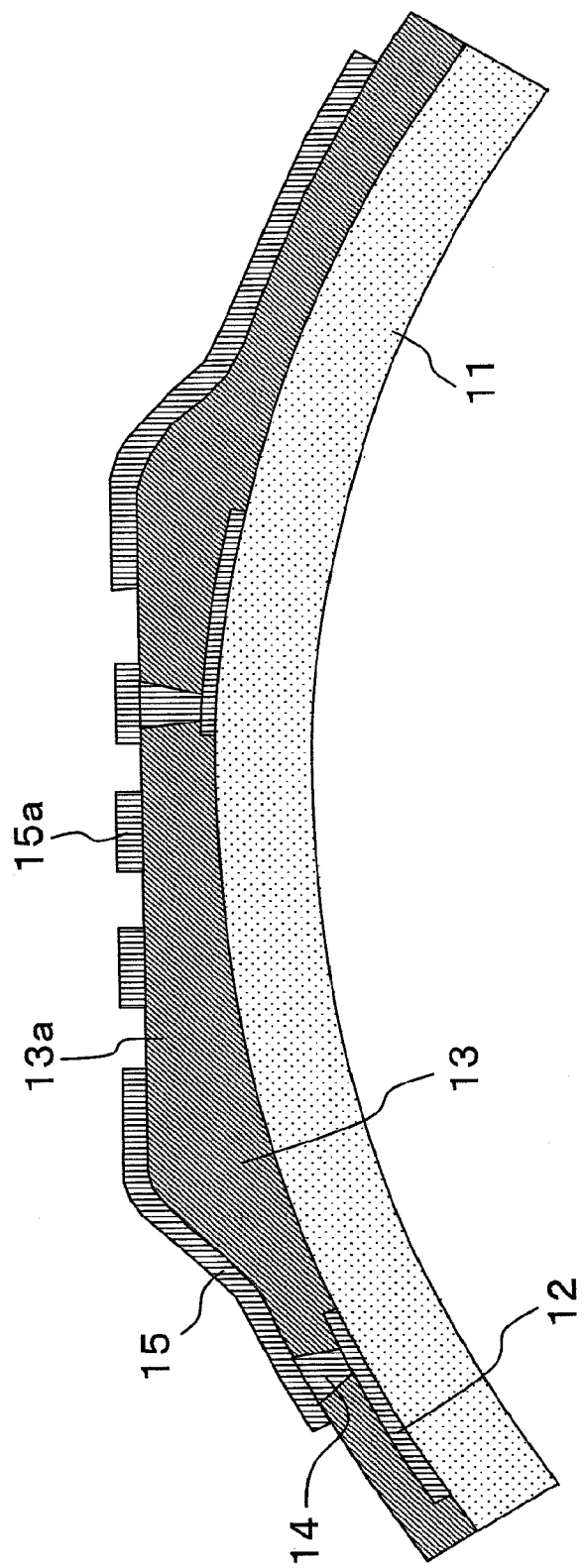

(FIRST EXEMPLARY EMBODIMENT)
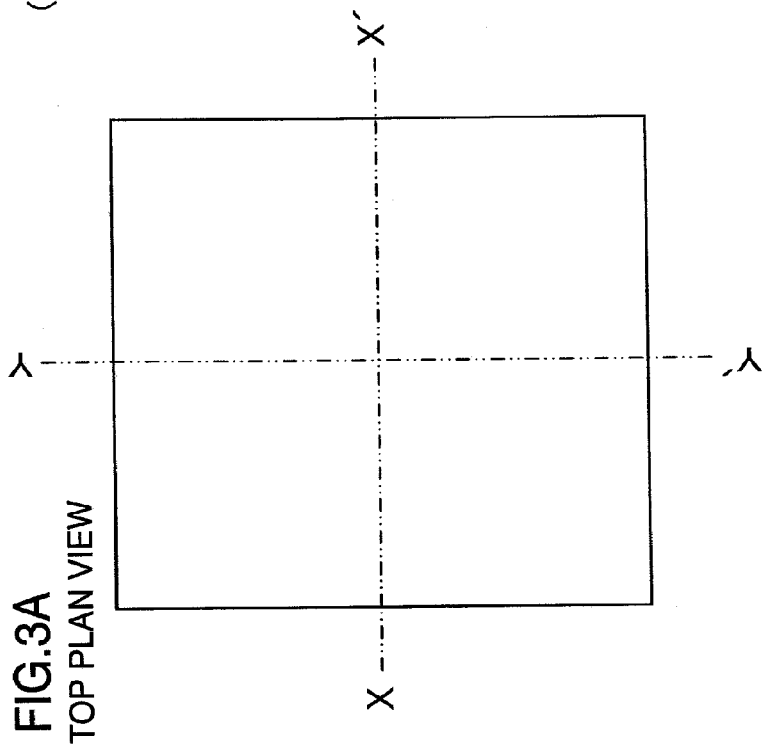
FIG.3A
TOP PLAN VIEW
FIG.3B
X-X' SECTION
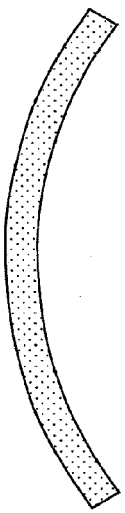
FIG.3C
Y-Y' SECTION
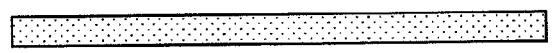

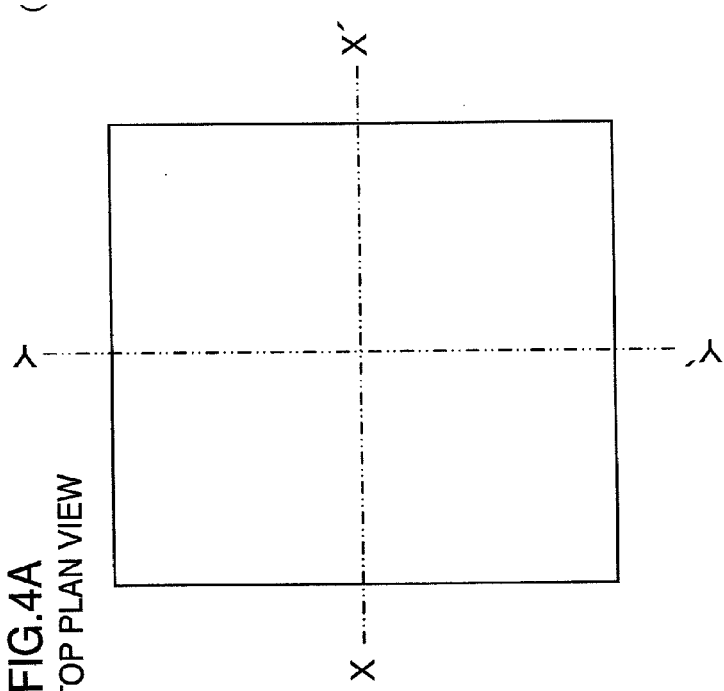
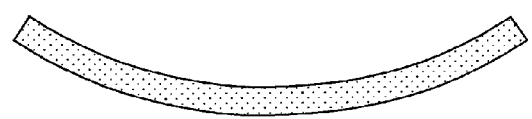
FIG.4A TOP PLAN VIEW
FIG.4B X-X' SECTION
FIG.4C Y-Y' SECTION
(FIRST EXEMPLARY EMBODIMENT)

(FIRST EXEMPLARY EMBODIMENT)

(FIRST EXEMPLARY EMBODIMENT)

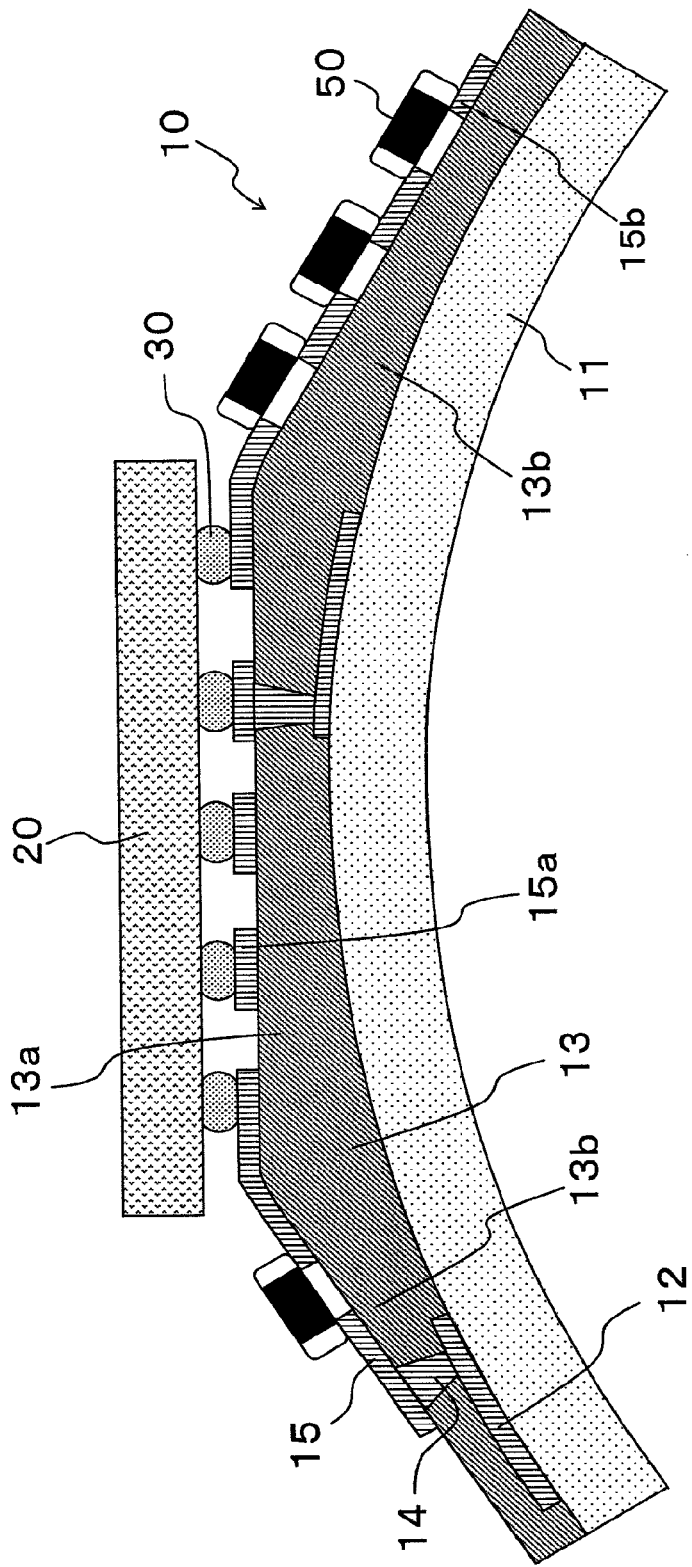

(SECOND EXEMPLARY EMBODIMENT)

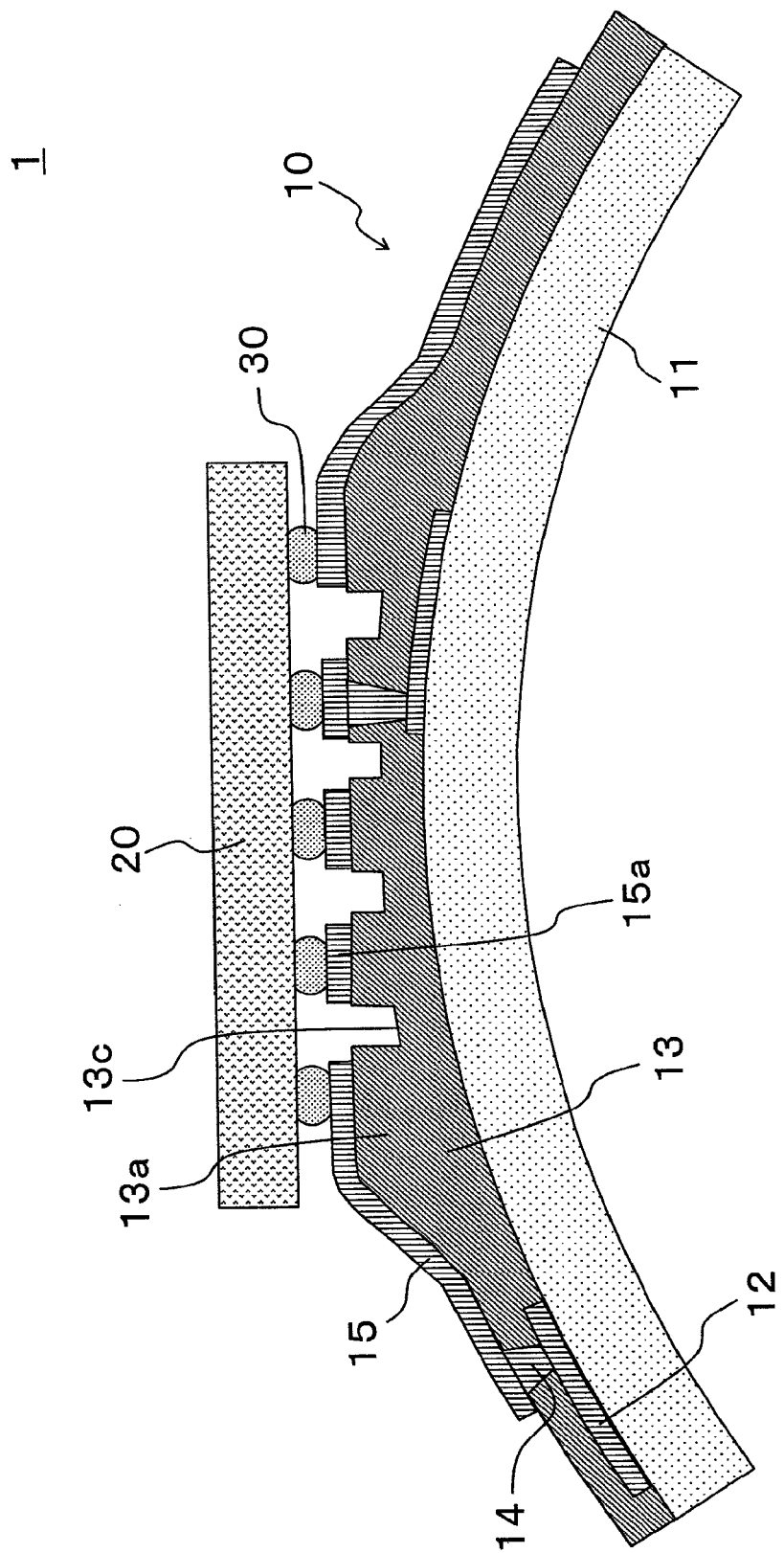
FIG.9 (THIRD EXEMPLARY EMBODIMENT)

(THIRD EXEMPLARY EMBODIMENT)

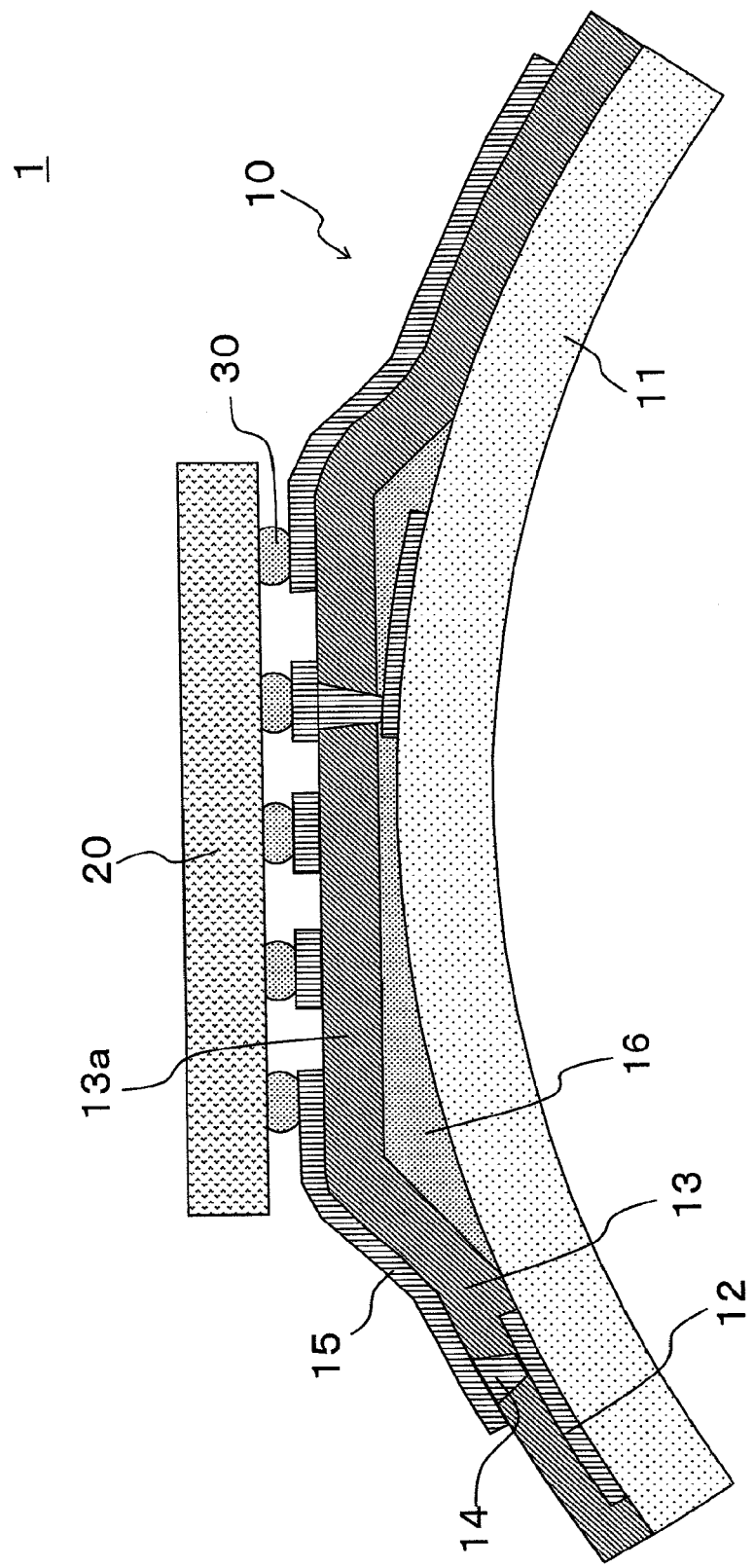
FIG.11 (FOURTH EXEMPLARY EMBODIMENT)

FIG.12A (FOURTH EXEMPLARY EMBODIMENT)
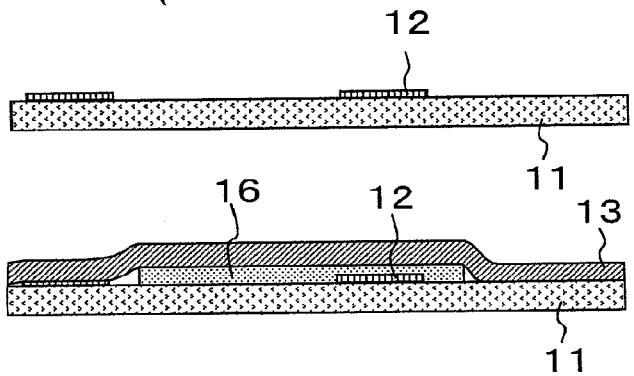
FIG.12B
FIG.12C
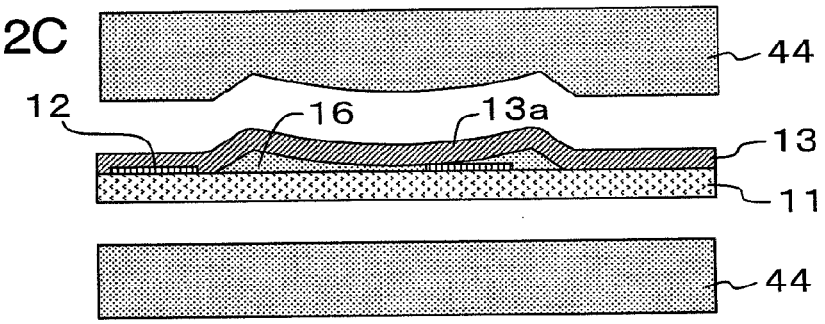
FIG.12D
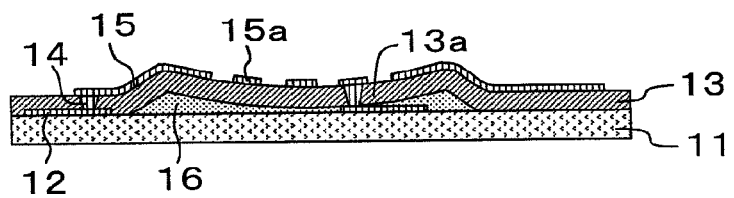
FIG.12E
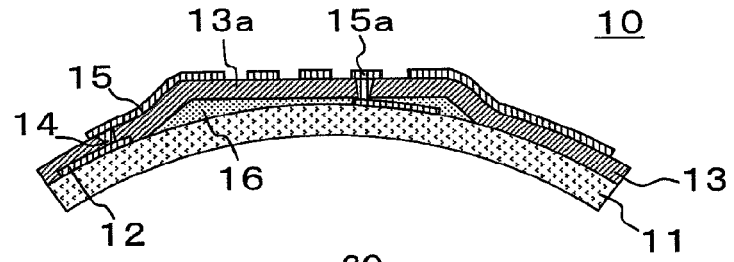
FIG.12F
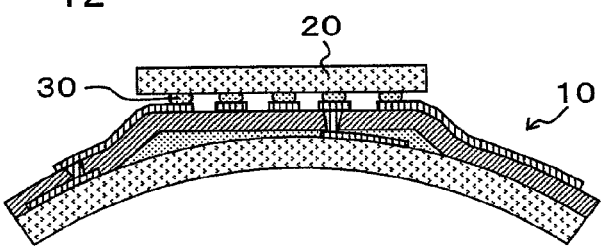

(FIFTH EXEMPLARY EMBODIMENT)

(SIXTH EXEMPLARY EMBODIMENT)

(SEVENTH EXEMPLARY EMBODIMENT)

(EIGHTH EXEMPLARY EMBODIMENT)

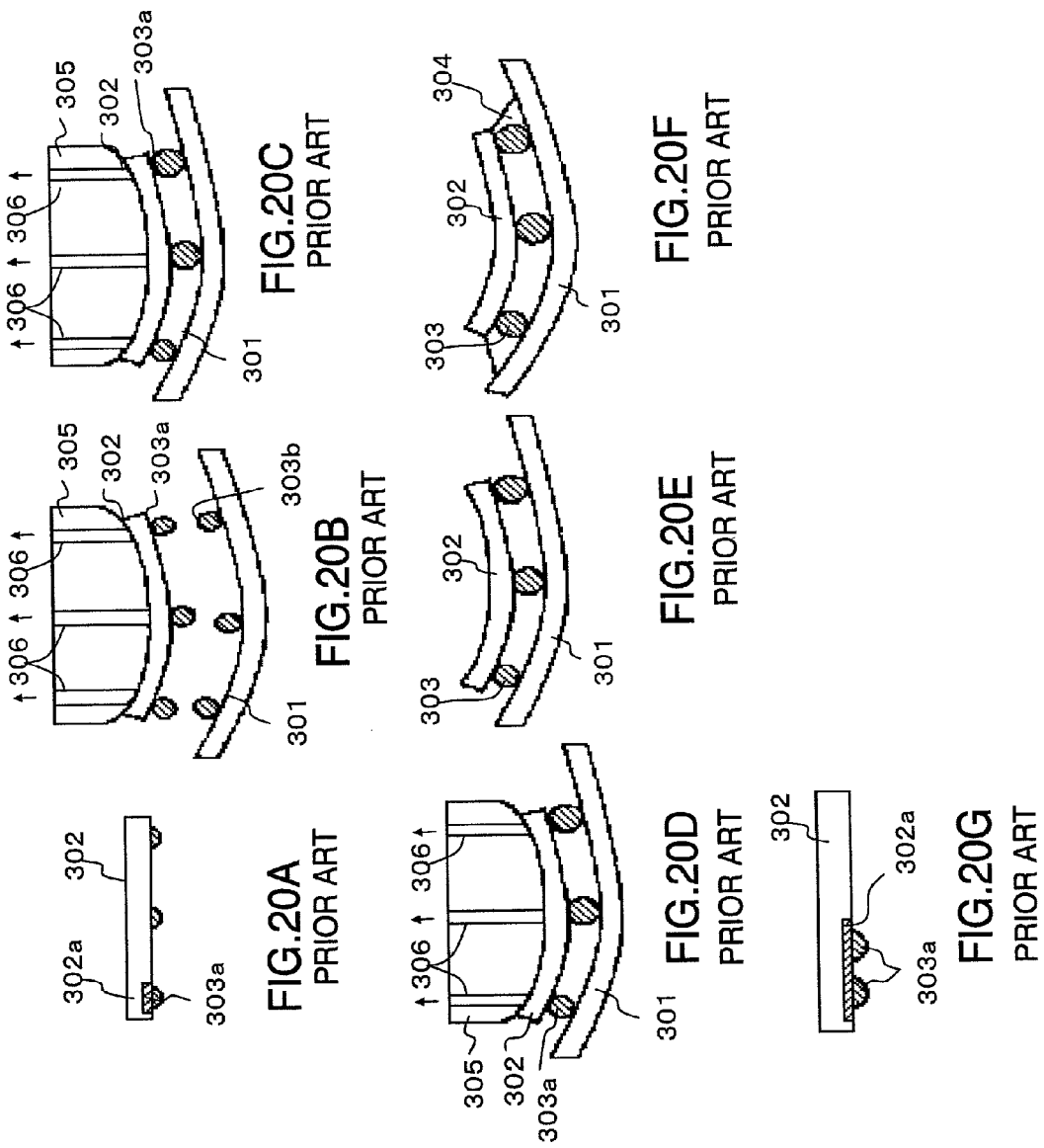

MOUNT BOARD AND ELECTRONIC DEVICE

CROSS REFERENCE TO RELATED APPLICATIONS

This application is a Continuation Application of U.S. patent application Ser. No. 13/158,037 filed Jun. 10, 2011, which is a divisional of U.S. patent application Ser. No. 12/093,496, filed May 13, 2008, which is a national stage entry of International Application No. PCT/JP2006/322251, filed Nov. 8, 2006, which claims priority from Japanese Patent Application No. 2005-334649, filed Nov. 18, 2005, the contents of all of which are incorporated herein by reference in their entirety.

TECHNICAL FIELD

The present invention relates to a mount board and an electronic device with electronic components mounted on a circuit board thereof. More specifically, the invention relates to a mount board and an electronic device with a curved circuit board.

BACKGROUND ART

Recently, portable devices represented by cellular phones have been thriving. Design of a portable device as well as higher functionality and higher performance of the portable device has been regarded as important. Then, in order to improve usability and appearance, a curved surface is being in heavy usage for the shape of a case of the portable device.

In a conventional mount board mounted within the case of the portable device, however, electronic components such as a semiconductor package are mounted on a flat board. Thus, it is difficult to efficiently arrange the electronic components within the case formed of various curved surfaces. For this reason, when the design is given priority, there is a problem that the size of the device may increase. Accordingly, it frequently happens that a design compromise must be inevitably made. Thus, it is strongly desired to put into practical use a board having a curved surface in conformity with the curved surface of the case, which is excellent in component arrangement efficiency within the case.

On the other hand, as a semiconductor package suited to the portable device, for which size reduction is required, a semiconductor package (a semiconductor device) as shown in FIG. 17 may be pointed out. In this semiconductor package, solder balls are arranged on a bottom surface of the package in a lattice form as connecting terminals. Such a package is described in Patent Document 1 and is referred to as a BGA (Ball Grid Array), a CSP (Chip Size Package), or a WL-CSP (Wafer Level Chip Size Package). Such a package is extensively used because more terminals can be arranged on this package with a smaller occupied area.

As a method of mounting this semiconductor package on the board, there is adopted the method of printing a cream solder on pads of the board using a metal mask, and melting the solder by reflowing after the semiconductor package has been mounted, thereby obtaining mechanical and electrical connection.

[Patent Document 1]
JP Patent No. P3395164 (FIG. 1)

[Patent Document 2]
JP Patent Kokai Publication No. JP-P2003-318218A (FIG. 2)

DISCLOSURE OF THE INVENTION

Problems to be Solved by the Invention

However, when the semiconductor package premised on being placed on the flat board is mounted on a board formed of a curved surface, there is a problem that a solder connection failure may occur according to the size of the semiconductor package or a curvature of a curved surface of a circuit board.

When mounting onto a board 203 having a convex curved surface as shown in FIG. 18 is performed, for example, a distance between a solder ball 202 and a pad 204 of the board 203 increases at an outer peripheral portion of a semiconductor package 201. Further, when mounting onto a concave curved surface as shown in FIG. 19 is performed, a distance between a solder ball 202 and a board 203 increases at the central portion of a semiconductor package 201. With respect to the boards 203 each having a curvature in some direction as shown in FIGS. 18 and 19 as well, the larger the curvature of the board 203 is and the larger the size of the semiconductor package 201 is, there tends to be a terminal at which the solder ball 202 doest not come into the pad 204 of the board 203. The solder connection failure is thereby brought about.

When the conventional semiconductor package is mounted on the curved board as described above, the solder connection failure caused by noncontact between a solder ball of the semiconductor package and a pad of the board may occur. Accordingly, the semiconductor package cannot be mounted on the board formed of the curved surface.

Then, as means for solving the problem of the connection failure that may occur when the semiconductor package as described in Patent Document 1 is mounted, Patent Document 2 proposes a method of curving a chip in accordance with the curvature of a board and then joining the chip to the curved surface of the board with the chip caused to follow the curved surface, thereby preventing occurrence of the connection failure (refer to FIG. 20).

However, when the chip is curved as described above, a warp may occur on the circuit surface of the chip. Then, a problem arises that a minute circuit formed on the surface of the chip may be thereby broken or electrical characteristics of the minute circuit may change. Electrical characteristics of an analog circuit in particular greatly change even by a minute warp, and this change in the electrical characteristics affects overall system performance. Thus, it is strongly desired to minimize stress that may be applied to the circuit surface of the chip.

Further, in recent years, a fragile insulating film (such as a low-k film) targeted for a faster operation has been adopted. Then, even in common flat-surface packages, a study of a lower-stress sealant, a lower-stress structure, or the like is made. To find out a way to achieve stress reduction is therefore an important challenge. In a step of mounting a semiconductor package as well, for example, it is necessary to find a way of restraining a warp of the semiconductor package during reflow heating when the semiconductor package is mounted on a board and minimizing stress that may be applied to a chip within the semiconductor package after the mounting.

As described above, there is a problem that the method of curving the chip, proposed in Patent Document 2 cannot be applied to the analog circuit of which electrical characteristics may greatly change and for which restraint of stress to be applied to a chip is therefore required, the semiconductor package formed of the fragile insulating film targeted for the faster operation, or the semiconductor chip.

A main challenge of the present invention is to allow stress that may be applied to a semiconductor package to be suppressed, when the semiconductor package is mounted on a curved board.

Means to Solve the Problems

A mount board according to a first aspect of the present invention is the mount board with a semiconductor package mounted on a curved board thereof, the curved board including a curved surface on at least a portion thereof. The curved board includes:

a pedestal portion disposed on a region of the curved-surface portion where the semiconductor package is mounted and having an upper surface thereof formed flat, the upper surface being formed of an insulating material; and a plurality of pad portions disposed on the flat surface of the pedestal portion. The semiconductor package is mounted on the pad portions.

A mount board according to a second aspect of the present invention is the mount board with a semiconductor package mounted on a curved board thereof, the curved board including a curved surface on at least a portion thereof. The curved board includes:

a pedestal portion disposed on a region of the curved-surface portion where the semiconductor package is mounted, the pedestal portion being formed of an insulating material;

the pedestal portion being formed by molding an insulating material other than an insulating material of an insulating layer used on the curved board;

the semiconductor package being disposed inside the pedestal portion;

external terminals of the semiconductor package being disposed on an opposite side of the surface of the board and being exposed from the pedestal portion;

the mount board comprising:

a wiring pattern disposed on at least the pedestal portion and the semiconductor package, the wiring pattern electrically connecting a wiring layer of the curved board and the external terminals of the semiconductor package.

A curved board according to a third aspect of the present invention is the curved board including a curved surface on at least a portion thereof. The curved board includes:

a pedestal portion disposed on a region of the curved-surface portion where a semiconductor package is mounted and having an upper surface thereof formed flat, the pedestal portion being formed of an insulating material; and a plurality of pad portions disposed on the flat surface of the pedestal portion.

An electronic device according to a fourth aspect of the present invention is configured by including the mount board or the curved board.

Effect of the Invention

According to the present invention (claimed in claims 1 thorough 21), the curved board having a locally flat portion is formed. On the locally flat portion, the pad portions on the board to be connected to the semiconductor package are formed to be flat. Accordingly, when the semiconductor package is mounted on the curved board, the semiconductor package can be mounted on pads arranged to be flat, as in the case where the semiconductor package is mounted on a common flat board. For this reason, a solder connection failure that may arise when a conventional common semiconductor package represented by a BGA is mounted on a curved board as shown in FIG. 18 or 19 can be suppressed. Further, it is not necessary to curve a semiconductor chip and mount the curved semiconductor chip, either. Mounting of the semiconductor package on the curved board can be realized in which no stress to the semiconductor chip included in the semiconductor chip will arise.

BRIEF DESCRIPTION OF THE DRAWINGS

FIG. 1 is a sectional view schematically showing a configuration of a mount board according to a first exemplary embodiment of the present invention;

FIG. 2 is a sectional view schematically showing a configuration of a curved board of the mount board according to the first exemplary embodiment of the present invention;

FIGS. 3A, 3B and 3C are respectively a top plan view, a sectional view taken along a line X-X', and a sectional view taken along a line Y-Y', which schematically show a first curved-surface shape of a base member of the mount board according to the first exemplary embodiment of the present invention;

FIGS. 4A, 4B and 4C are respectively a top plan view, a sectional view taken along a line X-X', and a sectional view taken along a line Y-Y', which schematically show a second curved-surface shape of the base member of the mount board according to the first exemplary embodiment of the present invention;

FIG. 7 is a sectional view schematically showing a configuration of a mount board according to a second exemplary embodiment of the present invention;

FIG. 9 is a sectional view schematically showing a configuration of a mount board according to a third exemplary embodiment of the present invention;

FIG. 11 is a sectional view schematically showing a configuration of a mount board according to a fourth exemplary embodiment of the present invention;

FIGS. 12A to 12F include step sectional views schematically showing a manufacturing method of the mount board according to the fourth exemplary embodiment of the present invention;

FIGS. 20A to 20G include step sectional views schematically showing a method of manufacturing a semiconductor package according to a fourth conventional art.

EXPLANATIONS OF SYMBOLS 1 mount board
10 curved board (circuit board)
11 base member (substrate)
12 wiring layer
13 insulating layer
13a pedestal portion
13b shoulder portion
13c concave portion
14 via
15 wiring layer
15a, 15b pad portion
16 second insulating layer
20 semiconductor package
21 external terminal
30 solder ball
40, 41, 42, 43, 44 press mold
50 electronic component
60 curved board
61 circuit board
61a insulating layer
61b wiring layer
61c via
61d wiring layer
62 pedestal portion
63 wiring layer (wiring pattern)
63a pad portion
110 semiconductor device
112 board
114 semiconductor chip
116 bump
118 structure
120 adhesive
122 underfill
124 ball bump
126 depressed portion
128 gap
201 semiconductor package
202 solder ball
203 board
204 pad
301 curved board
302 chip
302a electrode
303 solder bump
303a chip bump
303b board bump
304 underfill resin
305 heating/cooling head
306 adsorption hole Preferred Modes for Carrying Out the Invention First Exemplary Embodiment A mount board according to a first exemplary embodiment of the present invention will be described using drawings. FIG. 1 is a sectional view schematically showing a configuration of the mount board according to the first exemplary embodiment of the present invention. FIG. 2 is a sectional view schematically showing a configuration of a curved board in the mount board according to the first exemplary embodiment of the present invention. FIGS. 3A, 3B, and 3C are respectively a top plan view, a sectional view taken along a line X-X', and a sectional view taken along a line Y-Y', which schematically show a first curved surface shape of a base member in the mount board according to the first exemplary embodiment of the present invention. FIGS. 4A, 4B, and 4C are respectively a top plan view, a sectional view taken along a line X-X', and a sectional view taken along a line Y-Y', which schematically show a second curved surface shape of the base member in the mount board according to the first embodiment of the present invention.

Referring to FIG. 1, a mount board 1 is formed by mounting an electronic component such as a semiconductor package 20 on a curved board 10.

Figure 5A:
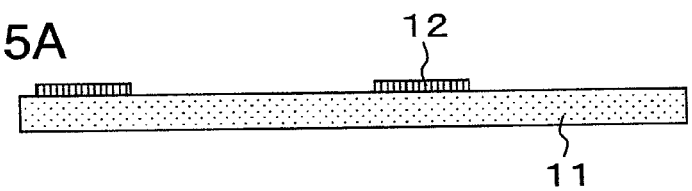
FIGS. 5A to 5E include step sectional views schematically showing a first manufacturing method of the mount board according to the first exemplary embodiment of the present invention.

The curved board 10 is a circuit board having a curved surface on at least a portion thereof. The curved board 10 includes a base member 11, a wiring layer 12, an insulating layer 13, vias 14, and a wiring layer 15.

The base member 11 is the one having a curved surface made of an insulating material. The base member 11 can be broadly classified into the base member having the curved surface that is curved in only one direction (curved only in an X-X' direction in the case of FIG. 3) as shown in FIG. 3 and the base member having the curved surface that is curved in two directions (curved in both of the X-X' direction and a Y-Y' direction in the case of FIG. 4) as shown in FIG. 4. Then, each curved surface may be the one having a free curved surface formed of a free-form curve as well as the one having a fixed curvature. The base member may partly or wholly have any one of these curved surfaces. A commonly available glass epoxy resin formed by impregnating a glass cloth with a resin may be employed for the base member 11. The material of the base member 11 is not limited to the glass epoxy resin, and an aramid nonwoven cloth may be employed instead of the glass cloth. Further, the base member 11 may be formed of a material having good curved-surface processability. A thermoplastic resin which is readily softened and deformed and of which a shape is easy to secure may be employed. To take an example, the resin, such as a liquid crystal polymer, may be employed.

The wiring layer 12 is a conductive layer formed on the base member 11. Like a common by available wiring material, a low-resistance material of copper with a small electrical resistance may be employed for the wiring layer 12.

The insulating layer 13 is the insulating layer formed over the wiring layer 12 and the base member 11. The insulating layer 13 has via holes that lead to the wiring layer 12 in predetermined locations thereof. The insulating layer 13 has a pedestal portion 13a with a flat upper surface, on a region of a curved-surface portion where the semiconductor package 20 is mounted. For the insulating layer 13, a semi-cured sheet-like prepreg commonly used for a build-up substrate may be employed, and as the material of the insulating layer 13, the common glass epoxy resin may be employed, as in the base member 11. The material of the insulating layer 13 is not limited to the glass epoxy resin, and the aramid unwoven cloth may be used instead of the glass cloth. The pedestal portion 13a is formed by molding the insulating layer 13. The pedestal portion 13a having a thinner thickness is desired in view of high-density mounting and a via formation property. In a location where a via is formed in particular, it is desirable that the thickness of the pedestal portion 13a be 150 µm or less, in view of the via formation property. When a distance between the lower wiring layer 12 and the upper wiring layer 15 is reduced, electrical characteristics such as an insulating property and an impedance characteristic may deteriorate. Thus, in terms of the electrical characteristics such as the insulating property and the impedance characteristic, it is desirable that the thickness of the pedestal portion 13a even in a thinnest region of the pedestal portion 13a be 15 µm or more. When a terminal pitch of the semiconductor package 20 to be mounted is narrow and a solder short is feared, a solder resist may be formed on a surface (an exposed surface) of the insulating layer 13.

The vias 14 are conductive portions that electrically connect the wiring layer 12 and the wiring layer 15. For the vias 14, a low-resistance material such as copper may be employed.

The wiring layer 15 is a conductive layer formed on the insulating layer 13. The wiring layer 15 includes pad portions 15a on predetermined locations of the flat surface of the pedestal portion 13a. The pad portions 15a are electrically connected to corresponding external terminals (not shown) of the semiconductor package 20 via solder balls 30. For the wiring layer 15, a low-resistance material such as copper may be employed. When taking into consideration stress that may be applied to the wiring layer 15 at a time of causing the wiring layer 15 to follow a curved surface or a concavo-convex shape of the insulting layer 13 including the pedestal portion 13a, a highly crack-resistant wiring material such as electrolytic copper, formed by an electrolytic plating method is preferable. The wiring layer 15 may be integrally formed with the vias 14, or may be formed separately from the vias 14a.

Herein, the common by available semiconductor package 20 with the solder balls 30 arranged in a lattice form is used as an example. The semiconductor package 20 is not limited to the one packaged by mold sealing or the like. The present invention can be applied to any electronic component that has been hitherto mounted on a conventional common by available flat board, such as a semiconductor chip that is not packaged, or a QFP (Quad Flat Package) including gull wing leads as external terminals.

Next, a first manufacturing method of the mount board according to the first exemplary embodiment will be described using drawings. FIGS. 5A to 5E include step sectional views schematically showing the first manufacturing method of the mount board according to the first exemplary embodiment of the present invention.

First, the wiring layer 12 is formed on the circuit board 11 (refer to FIG. 5A). Herein, the wiring layer 12 can be patterned by a subtractive method, an additive method, or a semi-additive method. In the subtractive method, a wiring pattern is formed by etching a surplus portion of copper foil or copper plating formed on the circuit board 11. In the additive or semi-additive method, the wiring layer 12 is formed by plating, after a portion except a wiring formation region has been masked by an insulating resin.

Figure 5B:
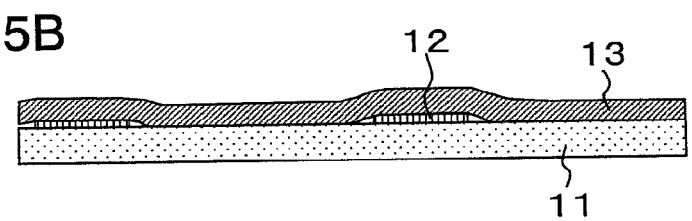

Next, the sheet-like insulating layer 13 is formed over the board 11 and the wiring layer 12 (refer to FIG. 5B).

Figure 5C:
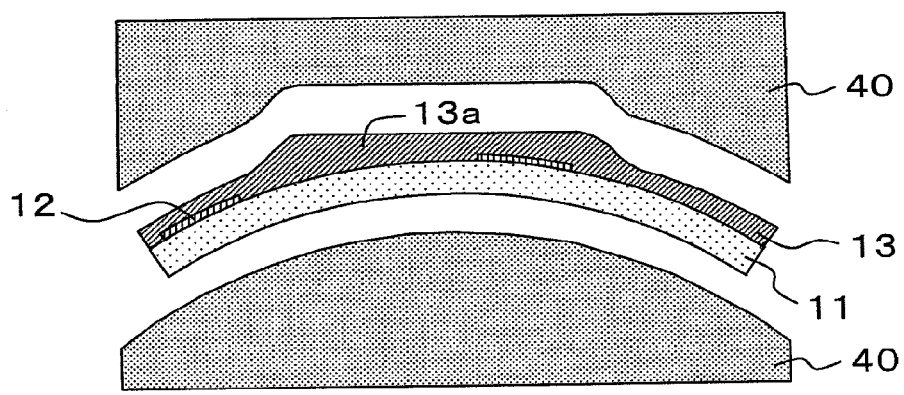

Next, molding of the pedestal portion 13a of the insulating layer 13 and molding of the curved surface of the board are simultaneously performed by press processing (refer to FIG. 5C). When the moldings and curing are performed in this step, the insulating layer 13 is heated and pressurized by press molds 40 each processed into a desired shape. The insulating layer 13 is thereby softened and flows inside the press molds 40. Then, the insulating layer 13 is cured into the shape defined by the press molds after having being filled into the shape defined by the press molds. By this heating and pressurization, the base member 11 is also softened and deformed. The curved surface of a desired shape can be thereby obtained. At the same time, the insulating layer 13 is cured, and the pedestal portion 13a that has the locally flat surface is thereby formed. A heating temperature in this case needs to be not less than a temperature at which the insulating layer 13 can be cured. Herein, a temperature of 120° C. or higher, which is a requirement for the prepreg to be cured, is applied. However, an optimum temperature differs depending on the material of the prepreg. Thus, the heating temperature is conditioned to accommodate the material of the prepreg. Further, in terms of a molding property in the mold, or in order for the resin material in the prepreg to flow and be uniformly filled into the mold, it is preferable that a high fluidity material be selected as the resin material of the prepreg.

Figure 5D:
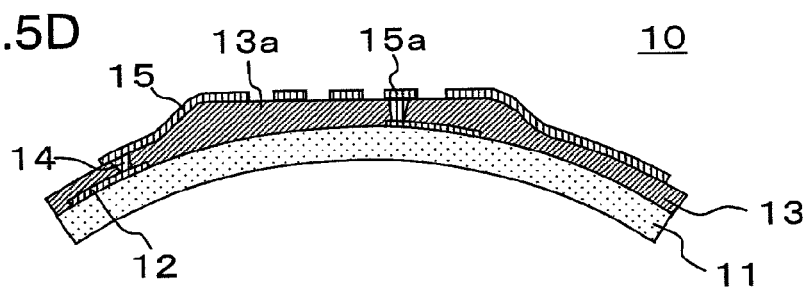
Figure 5E:
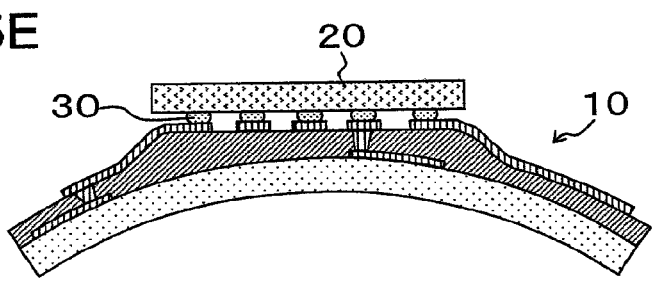

Next, the via holes are formed in the insulating layer 13, and then, the vias 14 and the wiring layer 15 are formed (refer to FIG. 5D). Herein, the via holes are formed by opening the cured insulating layer 13 by a laser or an etching method until the insulating layer 12 appears. The thicker the insulating layer 13 is, the more processability of the via holes is reduced. Accordingly, it is desirable that the insulating layer 13 be formed to be thin within a range that electrical characteristics thereof are not affected. Formation of the vias 14 and the wiring layer 15 is performed for an upper portion of the insulating layer 13 by patterning using the additive method or semi-additive method. When the vias 14 and the wiring layer 15 are formed, copper plating is used, and the plating is filled into the via holes. Electrical connection between the wiring layer 12 and the wiring layer 15 is thereby obtained. On this occasion, it is desirable that the surface of the insulating layer 13 be roughened by a desmear process or the like in order to improve an adhesion force between the wiring layers 15 and 13. Further, it is desirable that the surface of a location of the wiring layer 12 to which the plating will be applied is roughened, as in the insulating layer 13, in order to improve an adhesion force between each of vias 14 and the insulating layer 12. When the terminal pitch of the semiconductor package 20 to be mounted is narrow and the solder short is feared, the solder resist may be formed on the surface of the insulating layer 13 after the wiring layer 15 has been formed.

By the steps described above, the curved board 10 is formed. Then, by mounting the semiconductor package 20 on the curved board 10 via the solder balls 30, the mount board 1 is formed (refer to FIG. 5E).

Herein, an example of a two-layer structure formed of the wiring layers 12 and 15 is shown for simplicity. However, in the step in FIG. 5A, a multi-layer circuit board formed by lamination using a build-up process, a simultaneous lamination process, or the like may be employed for the base member 11, so that development into the multi-layer circuit board can be readily realized. Further, the pedestal portion 13a formed of the insulating layer 13 may be simultaneously formed on both surfaces of the base member 11. On that occasion, the pedestal portion 13a can be arranged on both surfaces of the base member 11 so that pads for the semiconductor package are flat. Both surface mounting of the semiconductor packages 20 is thereby possible.

Next, a second manufacturing method of the mount board according to the first exemplary embodiment will be described using drawings. FIGS. 6A to 6F include sectional views of processing steps schematically showing the second manufacturing method of the mount board according to the first exemplary embodiment of the present invention.

In the first manufacturing method in FIG. 5, molding of the insulating layer 13 having the pedestal portion 13a is performed simultaneously with curving of the entire board. In the second manufacturing method in FIG. 6, the molding of the pedestal portion 13a is performed separately from the curving of the entire board. The second manufacturing method will be described below.

Figure 6A:
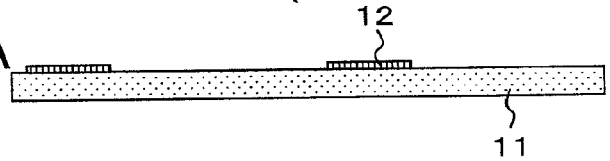
FIGS. 6A to 6F include step sectional views schematically showing a second manufacturing method of the mount board according to the first exemplary embodiment of the present invention.
Figure 6B:
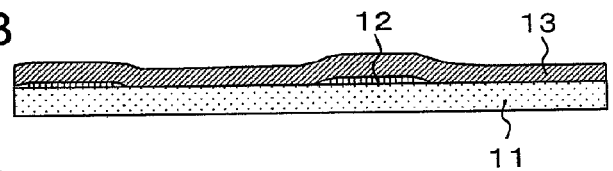

First, the wiring layer 12 is formed on the base member 11 (refer to FIG. 6A). Next, the sheet-like insulating layer 13 is formed over the base member 11 and the wiring layer 12 (refer to FIG. 6B). The steps described so far are the same as those in FIGS. 5A and 5B.

Figure 6C:
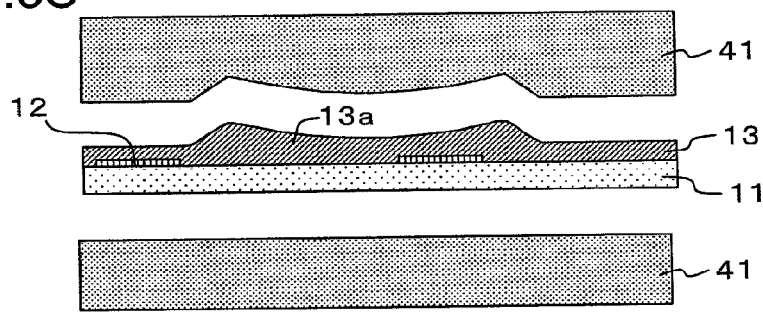
Figure 6D:
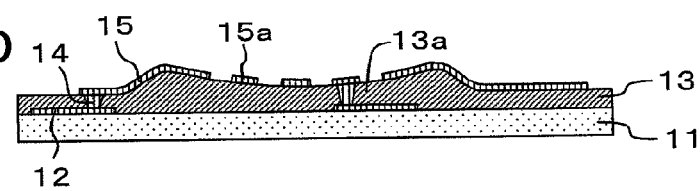

Next, the pedestal portion 13a of the insulating layer 13 is molded by press processing (refer to FIG. 6C). The pedestal portion 13a on which the semiconductor package 20 is mounted is molded into a shape having a curvature, on which the pads are flatly arranged, at a time of curving the board in a subsequent step.

Next, the via holes are formed in the insulating layer 13. Then, the vias 14 and the wiring layer 15 are formed (refer to FIG. 6D). Incidentally, this step is the same as that in FIG. 5D.

Figure 6E:
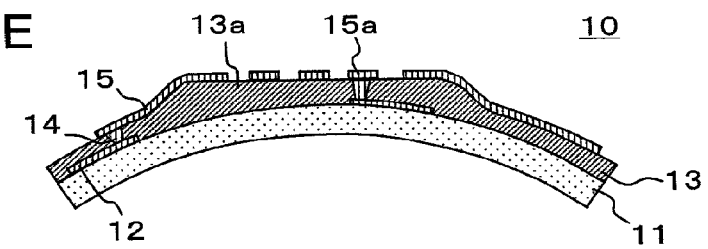
Figure 6F:
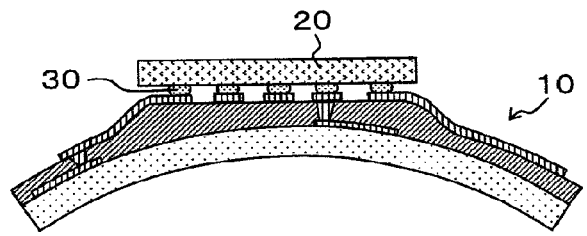

Next, using press molds (not shown), the entire board is curved by heating and pressurization (refer to FIG. 6E). As the press molds used in this step, the press molds which are similar to the press molds 40 shown in FIG. 5C may be employed.

By the steps described above, the curved board 10 is formed. By mounting the semiconductor package 20 on the curved board 10 via the solder balls 30, the mount board 1 is formed (refer to FIG. 6F).

As described above, separation between the molding step of the insulating layer 13 and the curving step of the entire board is effective when the curvature of the curved board 10 is extremely large or the area of the board is extremely large. When the curvature of the curved board 10 or the area of the board is extremely large, it is necessary for the wiring layer 15, facilities for forming the vias 14, and tooling to accommodate the curvature or the area of the curved board 10, in the step of forming the wiring layer 15 on the curved board 10 as shown in FIG. 5D, for example. However, the facilities and the tooling may become complex or the sizes of the facilities and the tooling may be increased. The facilities for forming the vias 14 are the facilities associated with the steps of the present invention such as an exposure machine for wiring, a photomask for wiring, a laser device for drilling the vias, and an etching layer for forming interconnects, for example. On the other hand, when the step of forming the prepreg and the step of curving the entire board are separated, the facilities related to formation of the wiring layer 15 and the vias 14 should only accommodate the curvature that defines a mounting range of the semiconductor package alone. Thus, there is an advantage that the conventional facilities can easily accommodate the curvature or the area of the curved board.

According to the first exemplary embodiment, even when the common semiconductor package 20 with the solder balls 30 arranged in the lattice form is mounted, space variations between the semiconductor package and respective pad portions can be suppressed. The space variations will occur when the semiconductor package is mounted on the pad portions formed on the curved surface of a conventional curved board. Soldering quality, which is the same as that when the semiconductor package is mounted on a flat board, can be thereby ensured. Further, it is not necessary to curve the semiconductor package 20 in conformity with the curved surface of the curved board 10, either. Thus, there is also no fear of electrical characteristic deterioration caused by a warp (or strain) of the semiconductor chip 20.

Second Exemplary Embodiment

A mount board according to a second exemplary embodiment of the present invention will be described using drawings. FIG. 7 is a sectional view schematically showing a configuration of the mount board according to the second exemplary embodiment of the present invention.

The mount board 1 according to the second exemplary embodiment has shoulder portions 13b on regions of the insulating layer 13 adjacent to the pedestal portion 13a. Each shoulder portion has a flat surface. The pad portions 15b for mounting electronic components 50 are formed on the insulating layer 15 on the shoulder portions 13b. The electronic components 50 are mounted on the pad portions 15b. The flat surface of the shoulder portion 13b is parallel to a tangent to the curved-surface portion. Other configurations are the same as those in the first exemplary embodiment. As the electronic components 50, chip components such as a resistor, a capacitor, a coil, and the like may be used. Other semiconductor packages represented by a BGA, a CSP, and a QFP except the chip components such as the resistor, capacitor, coil, and the like can also be mounted.

Next, a method of manufacturing the mount board according to the second exemplary embodiment will be described using drawings. FIGS. 8A to 8E include sectional views of processing steps schematically showing the method of manufacturing the mounding board according to the second exemplary embodiment of the present invention.

Figure 8A:
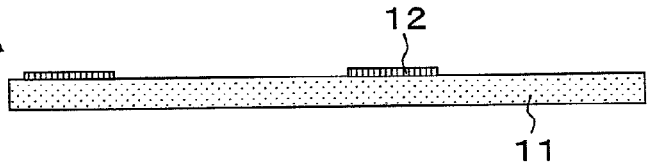
FIGS. 8A to 8E include step sectional views schematically showing a manufacturing method of the mount board according to the second exemplary embodiment of the present invention.
Figure 8B:
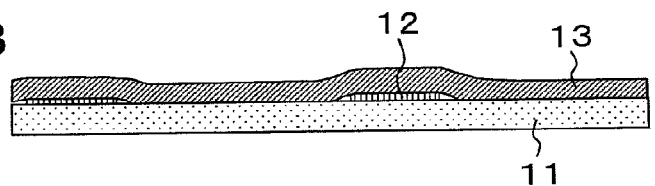

First, the wiring layer 12 is formed on the base member 11 (refer to FIG. 8A). Next, the sheet-like insulating layer 13 is formed over the base member 11 and the insulating layer 12 (refer to FIG. 8B). The steps described so far are the same as those in FIGS. 5A and 5B.

Figure 8C:
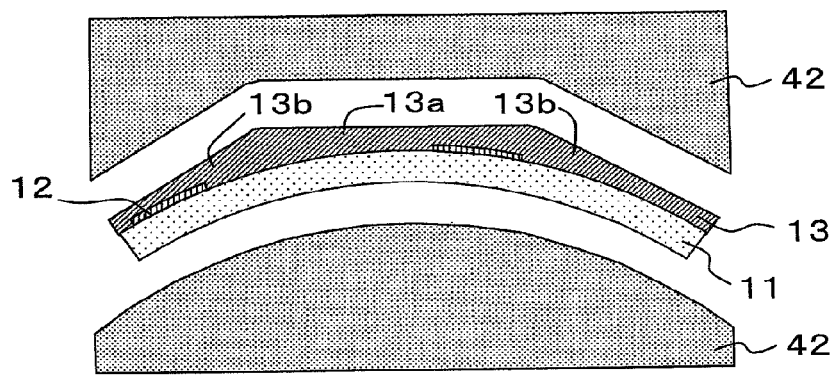
Figure 8D:
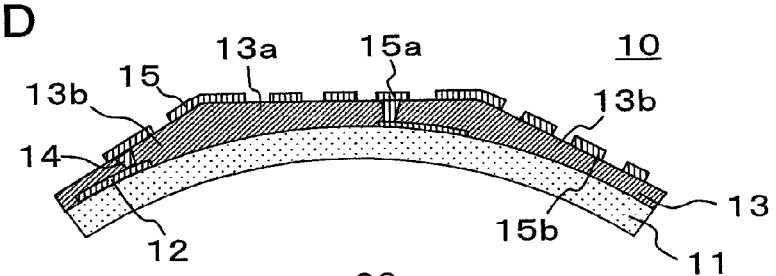
Figure 8E:
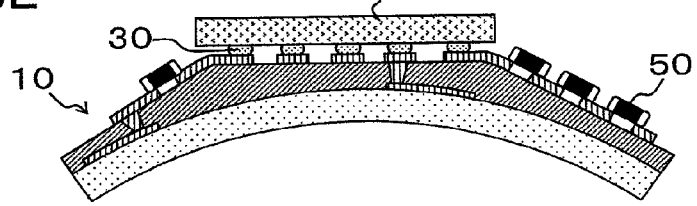

Next, molding of the pedestal portion 13a and the shoulder portions 13b of the insulating layer 13 and molding of the curved surface of the board are simultaneously performed by press processing, and the insulating layer 13 is cured (refer to FIG. 8C). Herein, shapes of press molds 42 are different from those of the press molds 40 in FIG. 5C in order to obtain the surface of each shoulder portion 13b in the form of a straight line close to the tangent to the curved surface of the base member 11.

Next, the via holes are formed in the insulating layer 13. Then, the vias 14 and the insulating layer 15 are formed (refer to FIG. 8D). Incidentally, when the wiring layer 15 is formed, the pad portions 15a for the semiconductor package and the pad portions 15b for the electronic components are formed.

By the above steps, the curved board 10 is formed. Then, the semiconductor package 20 is mounted on the curved board 10 via the solder balls 30, and the electronic components 50 are also mounted. The mount board 1 is thereby formed (refer to FIG. 8E).

According to the second exemplary embodiment, with respect to the shape of the pedestal portion 13a in the mount board 1, the surface of the shoulder portion 13b is formed flat as shown in FIG. 7. The electronic components 50 can be mounted on the shoulder portion 13b as well, so that a higher mounting density can be achieved. The capacitor and the coil in particular greatly affect electrical characteristics. Thus, it is desired that the capacitor and the coil be arranged as much as possible in the vicinity of the semiconductor package 20. When the structure of the mount board 1 according to the second exemplary embodiment is adopted, the electrical characteristics and product performance are improved. The closer the straight line defined by the shape of the shoulder portion 13 is to the tangent to the curved surface, the wider area of the flat part of the shoulder portion 13 can be ensured. The area for mounting can be thereby utilized to the fullest extent.

Third Exemplary Embodiment

A mount board according to a third exemplary embodiment of the present invention will be described using drawings. FIG. 9 is a sectional view schematically showing a configuration of the mount board according to the third exemplary embodiment of the present invention.

In the mount board 1 according to the third exemplary embodiment, concave parts (recesses) 13c are formed in the pedestal portion 13a of the insulating layer 13. The pad portions 15a are formed to be flat, irrespective of whether the upper surface of the pedestal portion is planarized or not. It means that, while planarization of the pad portions is achieved by planarizing the pedestal portion in the first and second exemplary embodiments, it is not always necessary for the pedestal portion 13a to be flat in the third exemplary embodiment if only the upper surfaces of the pad portions 15a are arranged to be flat. Other configurations are the same as those in the first exemplary embodiment.

Next, a method of manufacturing the mount board according to the third exemplary embodiment will be described using drawings. FIGS. 10A to 10E include sectional views of processing steps schematically showing the method of manufacturing the mount board according to the third exemplary embodiment of the present invention.

Figure 10A:
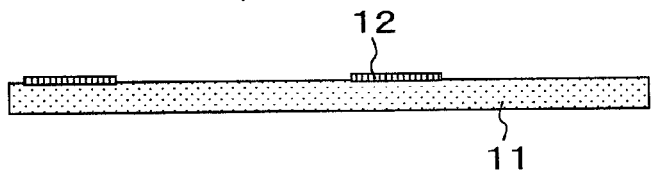
FIGS. 10A to 10E include step sectional views schematically showing a manufacturing method of the mount board according to the third exemplary embodiment of the present invention.
Figure 10B:
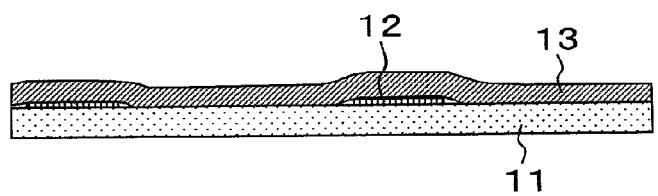

First, the wiring layer 12 is formed on the base member 11 (refer to FIG. 10A). Next, the sheet-like insulating layer 13 is formed over the base member 11 and the wiring layer 12 (refer to FIG. 10B). These steps described so far are the same as those in FIGS. 5A and 5B.

Figure 10C:
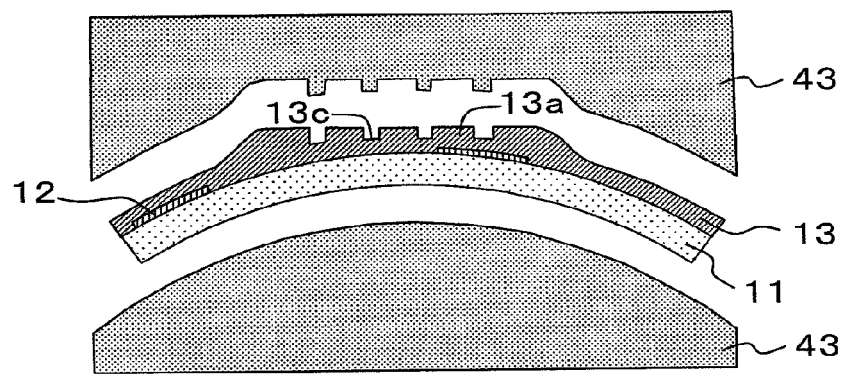
Figure 10D:
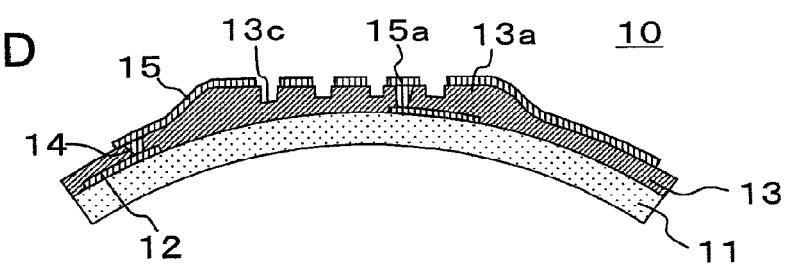
Figure 10E:
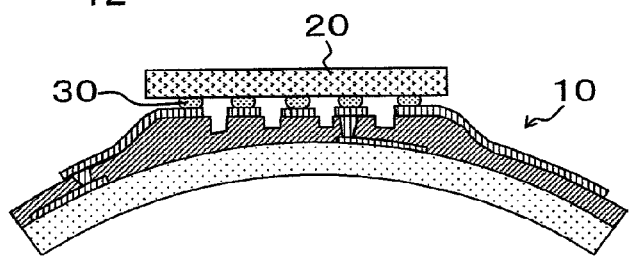

Next, molding of the pedestal portion 13a and the concave parts 13c of the insulating layer 13 and molding of the curved surface of the board are simultaneously performed (refer to FIG. 10C). Herein, a desired concavo-convex (i.e., profiled) shape is formed in a press mold 43 in advance.

Next, the via holes are formed in the insulating layer 13. Then, the vias 14 and the wiring layer 15 are formed (refer to FIG. 10D). By the steps described above, the curved board 10 is formed. Then, a semiconductor package 20 is mounted on the curved board 10 via solder balls 30. The mount board 1 is thereby formed (refer to FIG. 10E).

According to the third exemplary embodiment, by very simple means of a change in the shape of the press mold 43, a structure having the concave parts 13c of the pedestal portion 13a between the pad portions 15a can be implemented. Then, by including the concave parts 13c, an effect of easing stress caused by a difference between thermal expansion coefficients of the semiconductor package 20 and the curved board 10 can be expected. The stress may arise on an electric connecting portion such as solder or an interface between the solder and a pad due to an environmental load such as a temperature cycle. A mounting structure with higher reliability can be thereby obtained.

Fourth Exemplary Embodiment

A mount board according to a fourth exemplary embodiment of the present invention will be described using drawings. FIG. 11 is a sectional view schematically showing a configuration of the mount board according to the fourth exemplary embodiment of the present invention.

In the mount board 1 according to the fourth exemplary embodiment, a second insulating layer 16 is disposed between the pedestal portion 13a and the base member 11, as an auxiliary material for the insulating layer 13. Other configurations are the same as those in the first exemplary embodiment.

No particular limitation is imposed on the material of the second insulating layer 16 if only the material is the insulating material. A thermosetting resin film may be applied as a material of the second insulating layer 16. When a film material is employed, a laminate formed by laminating films so as to obtain a desired supply amount may be employed. As a more preferable material to be used for the second insulating layer 16, a thermoplastic resin may be pointed out. By employing the thermoplastic resin having a high softening level within a temperature range at a time of molding the insulating layer 13, improvement in a molding property of the pedestal portion 13a and a curved-surface molding property of the board can be expected. Further, for the second insulating layer 16, a material that will be melted by heating and then will be mixed into the prepreg may be employed. Alternatively, the second insulating layer 16 may be formed of a plurality of materials (in a hybrid-type resin including the thermoplastic resin and the thermosetting resin, for example). When rigidity is demanded, an inorganic material may be used for the second insulating layer 16.

Next, a method of manufacturing the mount board according to the fourth exemplary embodiment will be described using drawings. FIGS. 12A to 12F include sectional views of processing steps schematically showing the method of manufacturing the mount board according to the fourth exemplary embodiment of the present invention.

First, the wiring layer 12 is formed on the base member 11 (refer to FIG. 12A). Next, the second insulating layer 16 is formed at a position corresponding to the pedestal portion (indicated by reference numeral 13a in FIG. 12C) on the base member 11 and over the wiring layer 12. Then, the sheet-like (first) insulating layer 13 is formed over the base member 11, wiring layer 12, and second insulating layer 16 (refer to FIG. 12B). Next, the pedestal portion 13a of the wiring layer 13 is molded by press processing (refer to FIG. 12C). Next, the via holes are formed in the insulating layer 13 (and in the second wiring layer 16 depending on the position of a via hole). Then, the vias 14 and the insulating layer 15 are formed (refer to FIG. 12D). Next, using press molds (not shown), the entire board is curved by heating and pressurization (refer to FIG. 12E). Then, the semiconductor package 20 is mounted on the curved board 10 via the solder balls 30. The mount board 1 is thereby formed (refer to FIG. 12F).

According to the fourth exemplary embodiment, the second insulating layer 16 is disposed between the pedestal portion 13a and the base member 11. There may be a case where a sufficient amount for forming the pedestal portion 13a cannot be ensured with the insulating layer 13 alone because the curvature of the curved board 10 is large or the size of the semiconductor package 20 to be mounted is large. The mount board of the fourth exemplary embodiment can cope with such a case.

Fifth Exemplary Embodiment

Figure 13A:
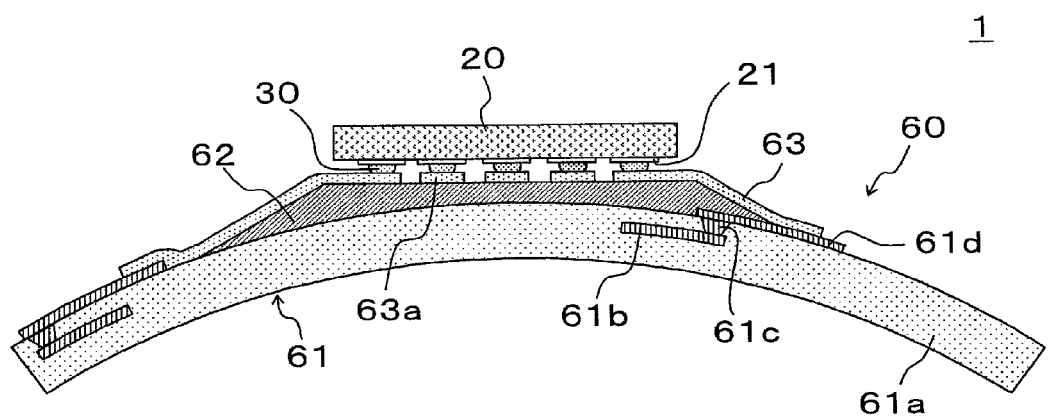
FIGS. 13A and 13B are sectional views each schematically showing a configuration of a mount board according to a fifth embodiment of the present invention, FIG. 13A relates to the mount board with a semiconductor package mounted on a convex surface side thereof, and FIG. 13B relates to the mount board with the semiconductor package mounted on a concave surface side thereof.
Figure 13B:
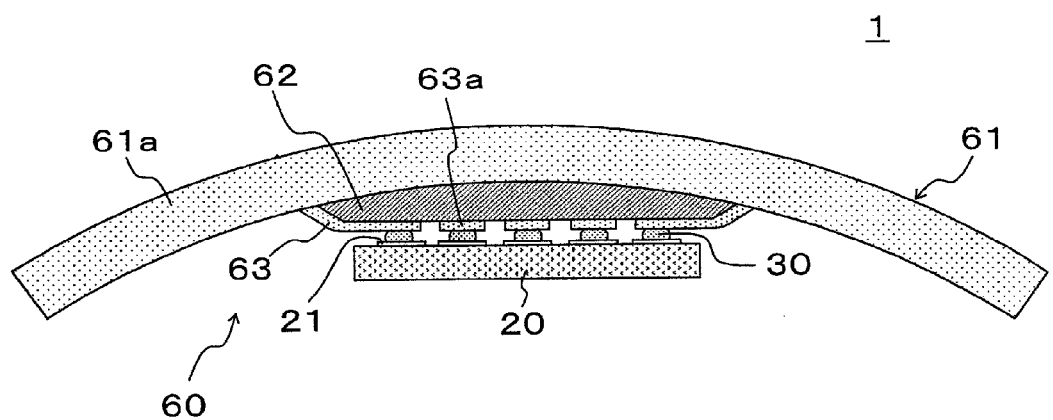

A mount board according to a fifth embodiment of the present invention will be described using drawings. FIGS. 13A and 13B are sectional views each schematically showing a configuration of the mount board according the fifth exemplary embodiment of the present invention. FIG. 13A relates to the mount board with the semiconductor package mounted on a convex side thereof, and FIG. 13B relates to the mount board with the semiconductor package mounted on a concave side thereof.

In the first to fourth exemplary embodiments, the pedestal portion is formed in the step of manufacturing the curved board (circuit board) using the insulating layer. In the fifth exemplary embodiment, a pedestal portion 62 is formed of an insulating material other than that used for an insulating layer 61a. The pedestal portion 62 is formed, separately from manufacture of a circuit board 61. In a mount board 1 according to the fifth exemplary embodiment, the pedestal portion 62 is arranged on the circuit board 61 having a curved surface. Then, a wiring layer 63 that is electrically connected to a wiring layer 61d on the circuit board 61 is formed on the pedestal portion 62. Pad portions 63a that lead to the wiring layer 63 are formed on the flat surface of the pedestal portion 62.

Herein, as the circuit board 61, a flat circuit board formed by a customary manufacturing method and then processed to have a curved surface by a method such as thermal pressing may be employed. In the circuit board 61, a wiring layer 61b is embedded within an insulating layer 61a, and a wiring layer 61d is disposed on the insulating layer 61a. The wiring layer 61d is electrically connected to the wiring layer 61b through each via 61c.

The pedestal portion 62 is formed on the curved circuit board 61. For the pedestal portion 62, an insulating material of a resin material, an inorganic material such as glass, or a filler-containing resin material may be employed. The resin material is an organic material. As the pedestal portion 62, the pedestal portion processed into the shape as shown in FIG. 13A or 13B in advance by a method such as resin molding or cutting molding (generally, shaping) may be attached. Alternatively, the pedestal portion 62 may be formed by printing and then curing a paste-like or a liquid-like material or curing by a molding method or the like.

The wiring layer 63 includes the pad portions 63a and is formed on the pedestal portion 62 so that the wiring layer 63 is electrically connected to the wiring layer 61d on the circuit board 61. The pad portions 63a are formed on the flat surface of the pedestal portion 62. For formation of the wiring layer 63, a method of drawing a conductive paste by printing or an ink jet method and then curing the drawn conductive past may be employed. The pad portions 63a are electrically connected to external terminals 21 of the semiconductor package 20 via the solder balls 30.

According to the fifth exemplary embodiment, interconnect (wiring) formation and lamination need not be performed on the curved surface of the circuit board 61 in the manufacturing step of the circuit board 61. Thus, in the manufacturing step of the circuit board 61, the flat circuit board manufactured by conventional facilities and the conventional method may be applied.

Sixth Exemplary Embodiment

Figure 14A:
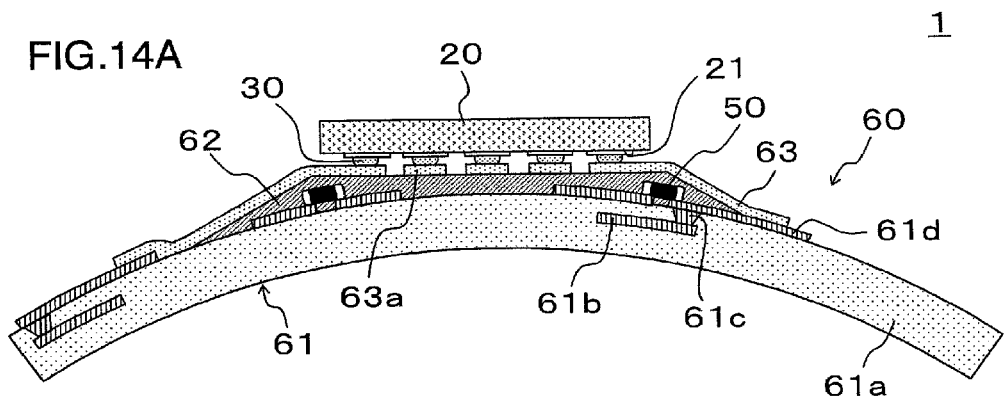
FIGS. 14A and 14B are sectional views each schematically showing a configuration of a mount board according to a sixth embodiment of the present invention, FIG. 14A relates to the mount board with the semiconductor package mounted on a convex surface side thereof, and FIG. 14B relates to the mount board with the semiconductor package mounted on a concave surface side thereof.
Figure 14B:
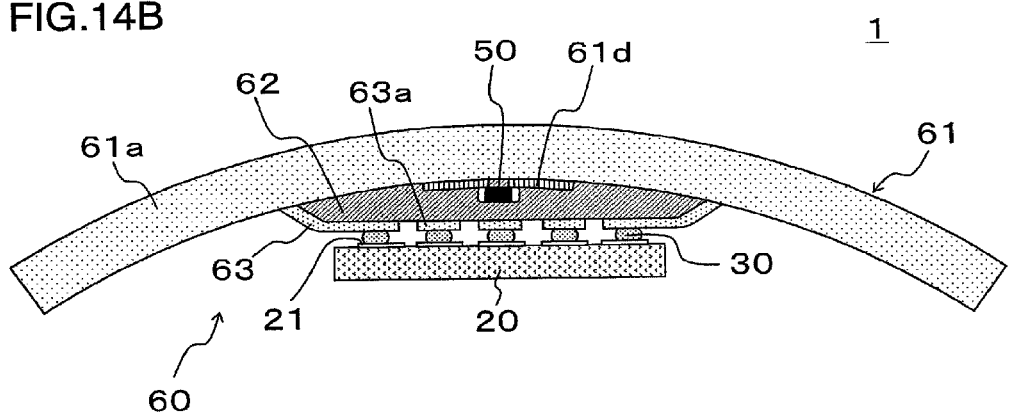

A mount board according to a sixth exemplary embodiment of the present invention will be described using drawings. FIGS. 14A and 14B are sectional views each schematically showing a configuration of a mount board according to the sixth exemplary embodiment of the present invention. FIG. 14A shows the mount board with a semiconductor package mounted on a convex side thereof. FIG. 14B shows a mount board with a semiconductor package mounted on a concave side thereof.

In the mount board 1 according to the sixth exemplary embodiment, electronic components 50 are included within a pedestal portion 62. Other configurations are the same as those in the fifth exemplary embodiment. The pedestal portion 62 is formed by mounting the other electronic component(s) 50 (such as a chip resistor, a chip capacitor, and a chip coil) on the curved circuit board 61 in advance and then performing post processing.

According to the sixth exemplary embodiment, the electronic component(s) 50 is (are) included within the pedestal portion 62. A higher density of mounting of the components can be therefore achieved, thereby allowing contribution to size reduction and thickness reduction of a final product. Further, the closer an electrical distance of the capacitor that becomes necessary for noise removal of the semiconductor package 20 to the semiconductor package is, the more the effect of noise removal is increased. Thus, significant performance improvement in terms of electrical characteristics as well can be expected. An effect can also be obtained in which a range of application to a high-speed semiconductor application or the like is expanded.

Seventh Exemplary Embodiment

Figure 15A:
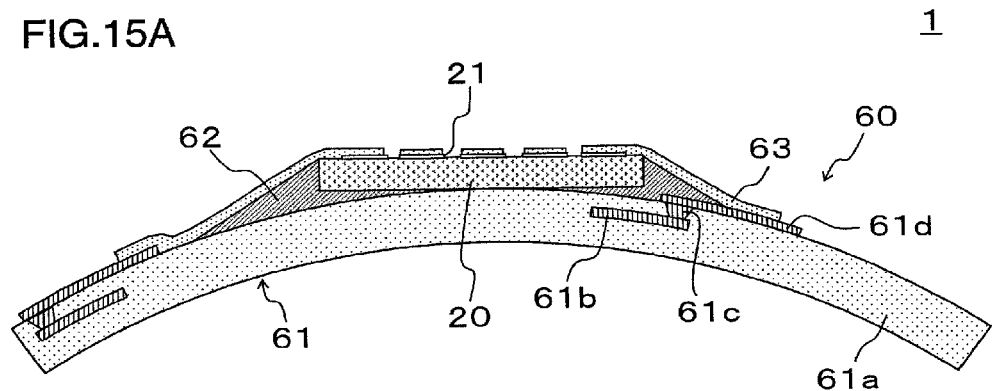
FIGS. 15A and 15B are sectional views each schematically showing a configuration of a mount board according to a seventh embodiment of the present invention, FIG. 15A relates to the mount board with a semiconductor package mounted on a convex surface side thereof, and FIG. 15B relates to the mount board with the semiconductor package mounted on a concave surface side thereof.
Figure 15B:
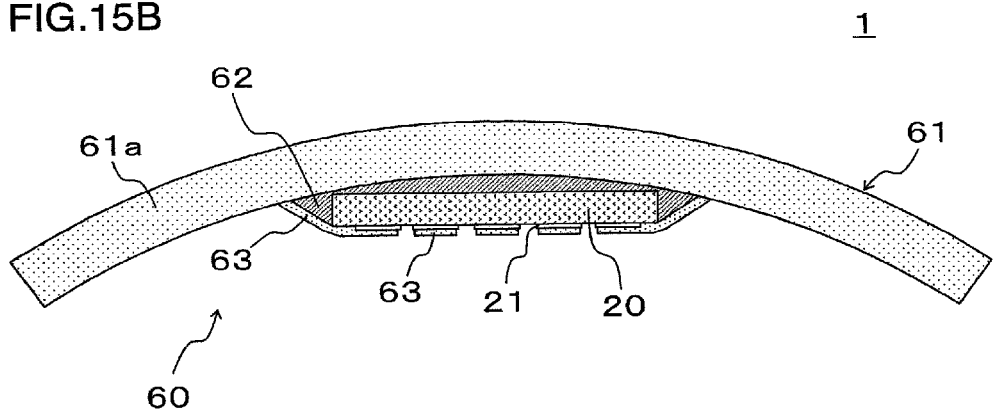

A mount board according to a seventh exemplary embodiment of the present invention will be described using drawings. FIGS. 15A and 15B are sectional views each schematically showing a configuration of a mount board according to the seventh exemplary embodiment of the present invention. FIG. 15A relates to a mount board with a semiconductor package mounted on a convex side thereof. FIG. 15B relates to a mount board with the semiconductor package mounted on a concave side thereof.

In a mount board 1 according to the seventh exemplary embodiment, a semiconductor package 20 is mounted within a pedestal portion 62. As a manufacturing method, the semiconductor package 20 is arranged on a curved circuit board 61 so that external terminals 21 of the semiconductor package 20 are placed on an opposite side of the surface of the board. Then, a paste-like insulating material or a liquid-like insulating material is printed and then cured, thereby forming the pedestal portion 62. A wiring layer 63 is formed over the semiconductor package 20 and the pedestal portion 62. The wiring layer 63 is formed of a conductive paste that has been drawn by printing or by an ink jet method and then cured. The wiring layer 63 is formed over the pedestal portion 62 and the semiconductor package 20 so that the wiring layer 63 is electrically connected to a wiring layer 61d on the circuit board 61 and the external terminals 21 of the semiconductor package 20.

As described above, by embedding the semiconductor package 20 within the pedestal portion 62, the occupied volume for mounting of the semiconductor package 20 can be minimized. This can greatly contribute to size reduction and thickness reduction of a final product.

Eighth Exemplary Embodiment

Figure 16A:
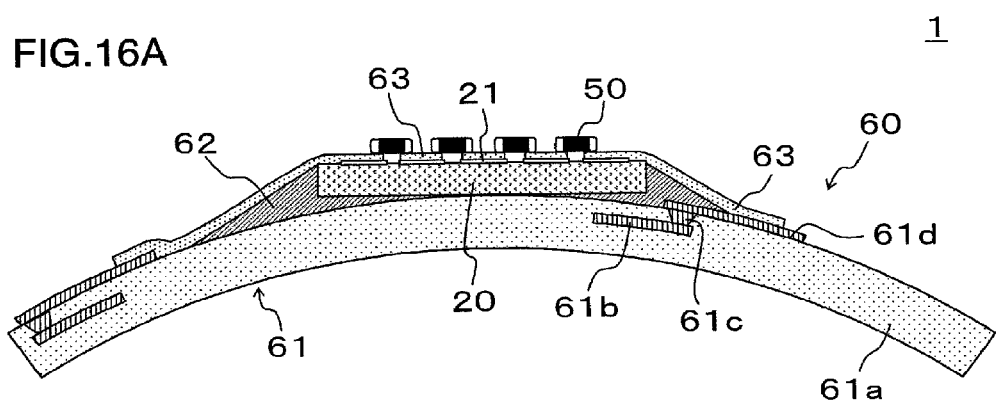
FIGS. 16A and 16B are sectional views each schematically showing a configuration of a mount board according to an eighth embodiment of the present invention, FIG. 16A relates to the mount board with the semiconductor package mounted on a convex surface side thereof, and FIG. 16B relates to the mount board with the semiconductor package mounted on a concave surface side thereof.
Figure 16B:
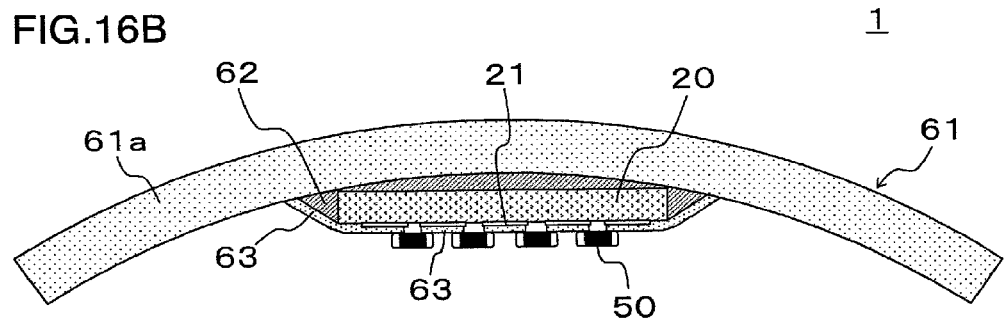
Figure 17:
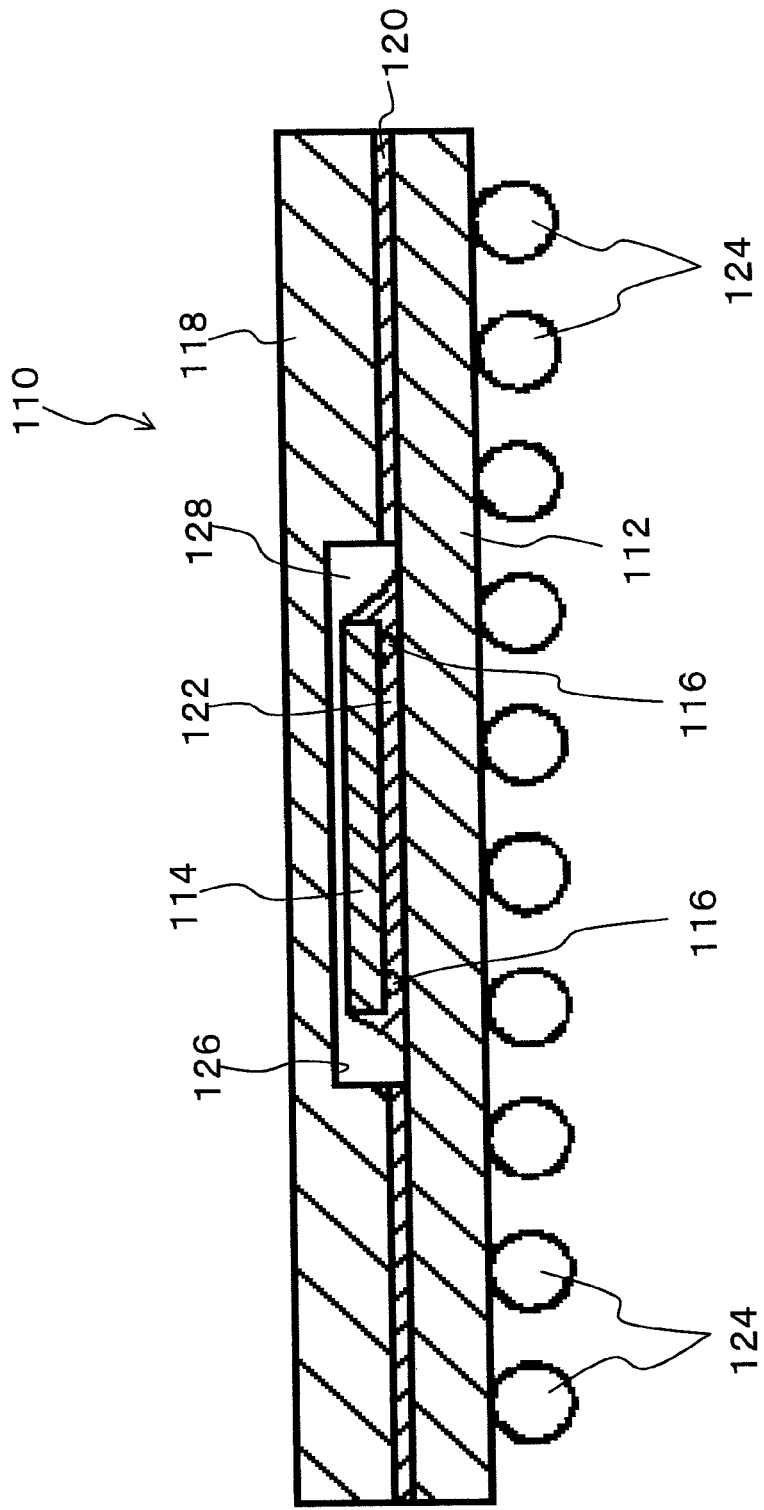
FIG. 17 is a sectional view schematically showing a configuration of a semiconductor package according to a first conventional art.
Figure 18:
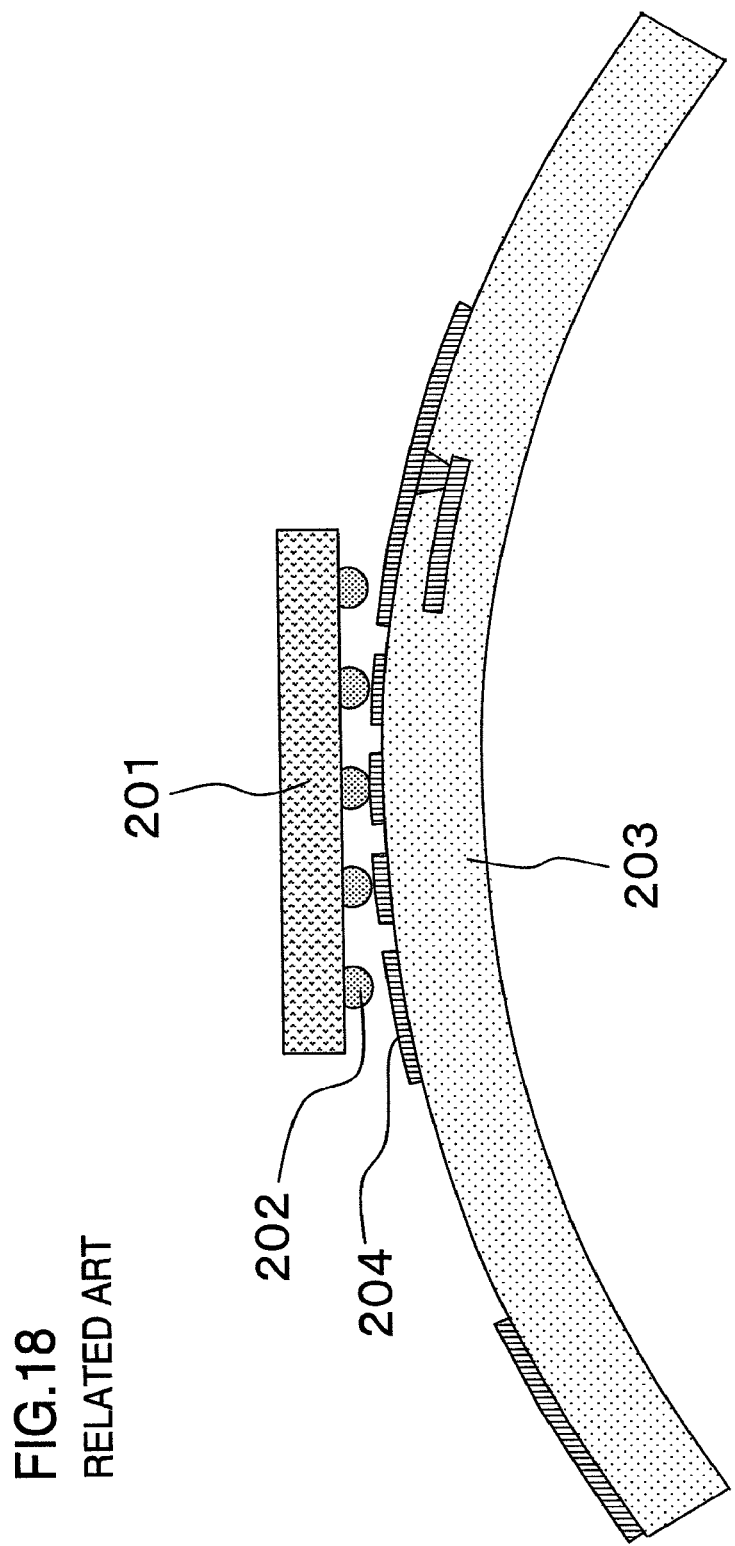
FIG. 18 is a sectional view of a mount board according to a second conventional art when a semiconductor package is mounted on a convex surface side of a curved board.
Figure 19:
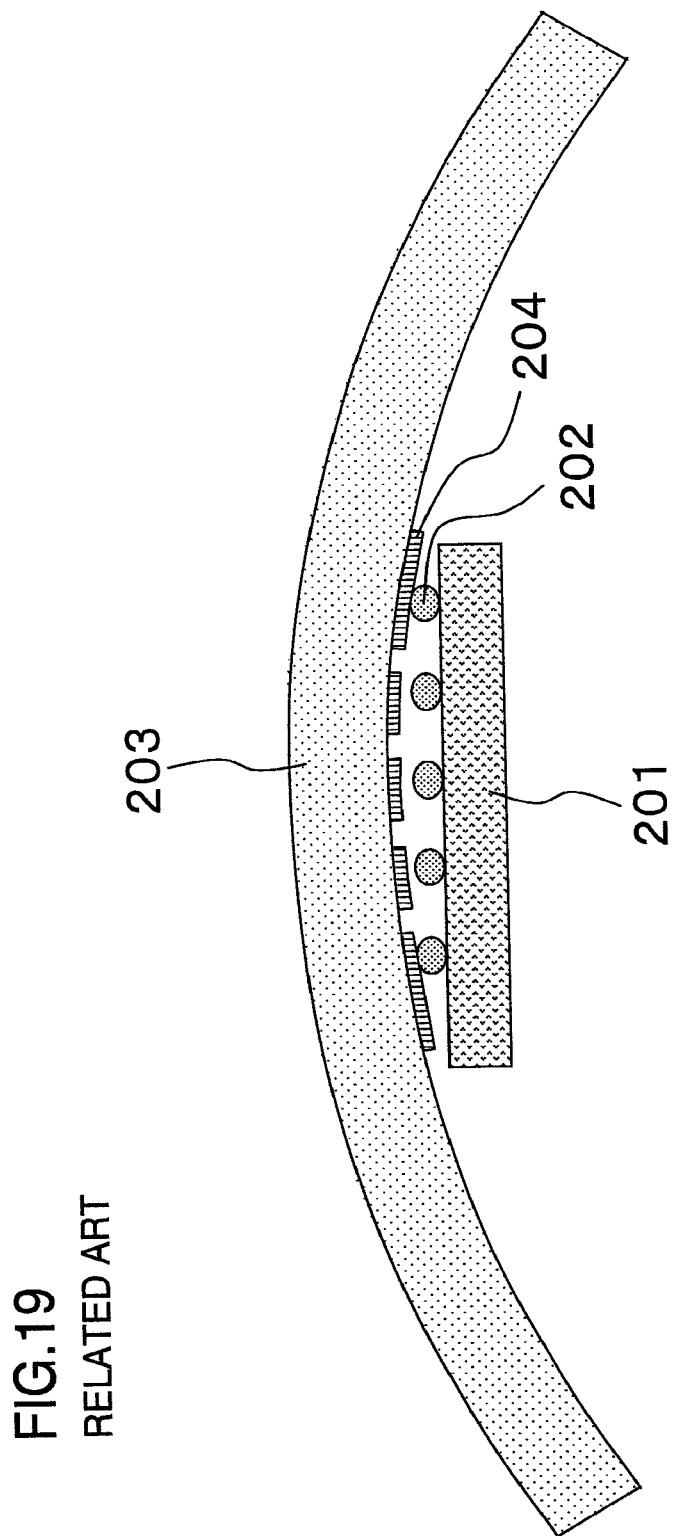
FIG. 19 is a sectional view of a mount board according to a third conventional art when a semiconductor package is mounted on a concave surface side of a curved board.

A mount board according to an eighth exemplary embodiment of the present invention will be described using drawings. FIGS. 16A and 16B are sectional views each schematically showing a configuration of the mount board according to the eighth exemplary embodiment of the present invention. FIG. 16A shows the mount board with the semiconductor package mounted on a convex side thereof. FIG. 16B shows the mount board with the semiconductor package mounted on a concave side thereof.

In the mount board 1 according to the eighth exemplary embodiment, the semiconductor package 20 is arranged within the pedestal portion 62. The electronic components 50 are mounted over the external terminals 21 of the semiconductor package 20 via the wiring layer 63. Other configurations are the same as those in the seventh exemplary embodiment.

According to the eighth exemplary embodiment, a high-density mounting structure that has efficiently utilized a mounting area can be obtained.

As described above, a mounting structure of the curved board in conformity with the curved surface of a case, which is excellent in component arrangement efficiency within the case for an electronic device formed of curved surfaces, can be implemented. Accordingly, by applying this structure to the electronic device of which design is regarded as important, a product's added value can be increased. The present invention is useful for being applied to a portable device such as a cellular phone, a digital still camera, a PDA (Personal Digital Assistant), a notebook personal computer, or the like for which size reduction and thickness reduction are particularly demanded.

What is claimed is:

1. A curved board including a curved surface on at least a portion thereof, comprising:
    a pedestal portion disposed on a region of said curved-surface portion where a semiconductor package is mounted and having an upper surface thereof formed flat, said pedestal portion being formed of an insulating material; and
    a plurality of pad portions disposed on said flat surface of said pedestal portions,
    wherein said pedestal portion is disposed on the concave side of said curved surface of said curved board.
2. The curved board according to claim 1, wherein said pedestal portion is formed by molding an insulating layer used on said curved board.
3. The curved board according to claim 1, wherein
    said insulating layer includes shoulder portions on regions thereof adjacent to said pedestal portion, each of said shoulder portions having a flat surface; and
    said flat surface of said each of said shoulder portions is formed to be parallel to a tangent to said curved-surface portion.
4. The curved board according to claim 3, comprising:
    a plurality of second pad portions disposed on said flat surface of said pedestal portion; and
    an electronic component(s) that is (are) mounted on said second pad portions.
5. The curved board according to claim 1, wherein said pedestal portion has a concave part in a region thereof between the pad portions adjacent to each other.
6. The curved board according to claim 1, wherein said pedestal portion is formed by including a second insulating layer therein.
7. The curved board according to claim 1, wherein said second insulating layer is formed of one of a laminate, a thermoplastic resin, a hybrid-type resin, and an inorganic material, said laminate being formed by laminating film-like resins, said hybrid-type resin including a thermoplastic resin and a thermosetting resin.
8. An electronic device comprising:
    the curved board according to claim 1.

* * * * *